United States Patent
Driscoll et al.

(10) Patent No.: US 7,019,984 B2
(45) Date of Patent: *Mar. 28, 2006

(54) INTERCONNECTION SYSTEM

(75) Inventors: Michael P. Driscoll, Deep River, CT (US); Stephen Vetter, Stafford, MO (US); Robert M. Bradley, Oakville, CT (US); Lee A. Wolfel, Goshen, CT (US); Robert O. Beadle, Enfield, CT (US)

(73) Assignee: Litton Systems, Inc., Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/151,463

(22) Filed: Jun. 14, 2005

(65) Prior Publication Data

US 2005/0245105 A1    Nov. 3, 2005

Related U.S. Application Data

(63) Continuation of application No. 10/234,859, filed on Sep. 5, 2002, now Pat. No. 6,910,897, which is a continuation-in-part of application No. 10/036,796, filed on Jan. 7, 2002, now Pat. No. 6,843,657.

(60) Provisional application No. 60/260,893, filed on Jan. 12, 2001, provisional application No. 60/328,396, filed on Oct. 12, 2001.

(51) Int. Cl.
    *H01R 12/16*    (2006.01)
(52) U.S. Cl. ................ 361/788; 361/789; 361/803; 439/65
(58) Field of Classification Search ............ 361/788, 361/789, 803; 439/65; 174/36, 35 C
    See application file for complete search history.

(56) References Cited

U.S. PATENT DOCUMENTS

| | | |
|---|---|---|
| 3,035,244 A | 5/1962 | Avenl |
| 3,208,028 A | 9/1965 | Mittler et al. |
| 3,432,801 A | 3/1969 | Ruotolo |
| 3,564,343 A | 2/1971 | Guest et al. |
| 3,636,239 A | 1/1972 | Robbins et al. |
| 3,761,842 A | 9/1973 | Gandrud |
| 4,008,941 A | 2/1977 | Smith |
| 4,017,770 A | 4/1977 | Valfré |
| 4,148,543 A | 4/1979 | Shores |
| 4,157,612 A | 6/1979 | Rainal |
| 4,175,821 A | 11/1979 | Hunter |
| 4,206,963 A | 6/1980 | English et al. |
| 4,211,466 A | 7/1980 | Reynolds |
| 4,265,549 A | 5/1981 | Cote |
| 4,331,370 A | 5/1982 | Andrews et al. |
| 4,338,717 A | 7/1982 | Damon |
| 4,382,653 A | 5/1983 | Blanchard |
| 4,397,516 A | 8/1983 | Koren et al. |
| 4,457,574 A | 7/1984 | Walters |
| 4,477,022 A | 10/1984 | Shuey et al. |
| 4,571,014 A | 2/1986 | Robin et al. |
| 4,596,432 A | 6/1986 | Tighe, Jr. |
| 4,686,607 A | 8/1987 | Johnson |
| 4,689,721 A | 8/1987 | Damerow et al. |
| 4,697,858 A | 10/1987 | Balakrishnan |

(Continued)

FOREIGN PATENT DOCUMENTS

EP    0284245 A1    9/1988

(Continued)

*Primary Examiner*—Hung V. Ngo
(74) *Attorney, Agent, or Firm*—Rothwell, Figg, Ernst & Manbeck

(57) ABSTRACT

The invention relates to an electrical connector that can be used to electrically connect a daughtercard to a backplane.

20 Claims, 26 Drawing Sheets

U.S. PATENT DOCUMENTS

| | | | |
|---|---|---|---|
| 4,705,332 A | 11/1987 | Sadigh-Behzadi | |
| 4,755,765 A | 7/1988 | Ferland | |
| 4,806,107 A | 2/1989 | Arnold et al. | |
| 4,816,791 A | 3/1989 | Carnahan et al. | |
| 4,820,170 A | 4/1989 | Redmond et al. | |
| 4,836,791 A | 6/1989 | Grabbe et al. | |
| 4,846,727 A | 7/1989 | Glover et al. | |
| 4,861,272 A | 8/1989 | Clark | |
| 4,867,707 A | 9/1989 | Widdoes | |
| 4,871,321 A | 10/1989 | Johnson | |
| 4,891,616 A | 1/1990 | Renken et al. | |
| 4,898,539 A | 2/1990 | Glover et al. | |
| 4,900,258 A | 2/1990 | Hnatuck et al. | |
| 4,924,918 A | 5/1990 | Lin et al. | |
| 4,941,831 A | 7/1990 | Tengler et al. | |
| 4,946,392 A | 8/1990 | Kobler et al. | |
| 4,947,144 A | 8/1990 | Le Nohaic | |
| 4,975,084 A | 12/1990 | Fedder et al. | |
| 4,979,903 A | 12/1990 | Gosselin | |
| 4,988,306 A | 1/1991 | Hopfer, III et al. | |
| 5,007,843 A | 4/1991 | Smolley | |
| RE33,611 E | 6/1991 | Michaels et al. | |
| 5,027,088 A | 6/1991 | Shimizu et al. | |
| 5,037,314 A | 8/1991 | Bricaud et al. | |
| 5,046,960 A | 9/1991 | Fedder | |
| 5,055,069 A | 10/1991 | Townsend et al. | |
| 5,066,236 A | 11/1991 | Broeksteeg | |
| 5,083,238 A | 1/1992 | Bousman | |
| 5,104,341 A | 4/1992 | Gilissen et al. | |
| 5,114,355 A | 5/1992 | Kimmel et al. | |
| 5,118,300 A | 6/1992 | Zarreii | |
| 5,119,886 A | 6/1992 | Fletcher et al. | |
| 5,122,064 A | 6/1992 | Zarreii | |
| 5,122,065 A | 6/1992 | Dudek et al. | |
| 5,127,837 A | 7/1992 | Shah et al. | |
| 5,158,471 A | 10/1992 | Fedder et al. | |
| 5,163,834 A | 11/1992 | Chapin et al. | |
| 5,167,531 A | 12/1992 | Broschard, III et al. | |
| 5,169,343 A | 12/1992 | Andrews | |
| 5,174,770 A | 12/1992 | Sasaki et al. | |
| 5,175,928 A | 1/1993 | Grabbe | |
| 5,186,647 A | 2/1993 | Denkmann et al. | |
| 5,197,893 A | 3/1993 | Morlion et al. | |
| 5,199,906 A | 4/1993 | Wang | |
| 5,215,473 A | 6/1993 | Brunker et al. | |
| 5,226,835 A | 7/1993 | Baker, III et al. | |
| 5,249,974 A | 10/1993 | Wang | |
| 5,259,773 A | 11/1993 | Champion et al. | |
| 5,277,590 A | 1/1994 | Thomas et al. | |
| 5,282,754 A | 2/1994 | Kish et al. | |
| 5,286,212 A | 2/1994 | Broeksteeg | |
| 5,292,256 A | 3/1994 | Brunker et al. | |
| 5,295,867 A | 3/1994 | Bethurum | |
| 5,299,956 A | 4/1994 | Brownell et al. | |
| 5,316,489 A | 5/1994 | Kachlic et al. | |
| 5,334,962 A | 8/1994 | Higgins et al. | |
| 5,340,334 A | 8/1994 | Nguyen | |
| 5,342,211 A | 8/1994 | Broeksteeg | |
| 5,354,219 A | 10/1994 | Wanjura | |
| 5,380,216 A | 1/1995 | Broeksteeg et al. | |
| 5,387,114 A | 2/1995 | Brunker et al. | |
| 5,388,997 A | 2/1995 | Grange et al. | |
| 5,395,249 A | 3/1995 | Reynolds et al. | |
| 5,399,105 A | 3/1995 | Kaufman et al. | |
| 5,401,912 A | 3/1995 | Mattei | |
| 5,404,117 A | 4/1995 | Walz | |
| 5,414,393 A | 5/1995 | Rose et al. | |
| 5,429,520 A | 7/1995 | Morlion et al. | |
| 5,432,484 A | 7/1995 | Klas et al. | |
| 5,433,618 A | 7/1995 | Morlion et al. | |
| 5,443,401 A | 8/1995 | Champion et al. | |
| 5,443,617 A | 8/1995 | Takahashi | |
| 5,454,738 A | 10/1995 | Lim et al. | |
| 5,460,533 A | 10/1995 | Broeksteeg et al. | |
| 5,467,040 A | 11/1995 | Nelson et al. | |
| 5,470,244 A | 11/1995 | Lim et al. | |
| 5,479,321 A | 12/1995 | Mair et al. | |
| 5,483,020 A | 1/1996 | Hardie et al. | |
| 5,484,310 A | 1/1996 | McNamara et al. | |
| 5,490,787 A | 2/1996 | Bowman et al. | |
| 5,495,075 A | 2/1996 | Jonckheere et al. | |
| 5,496,183 A | 3/1996 | Soes et al. | |
| 5,501,613 A | 3/1996 | Lenoir | |
| 5,513,065 A | 4/1996 | Caveney et al. | |
| 5,516,294 A | 5/1996 | Andrews et al. | |
| 5,522,727 A | 6/1996 | Saito et al. | |
| 5,539,360 A | 7/1996 | Vannatta et al. | |
| 5,547,405 A | 8/1996 | Pinney et al. | |
| 5,552,565 A | 9/1996 | Cartier et al. | |
| 5,554,038 A | 9/1996 | Morlion et al. | |
| 5,577,935 A | 11/1996 | Harting et al. | |
| 5,586,914 A | 12/1996 | Foster, Jr. et al. | |
| 5,597,313 A | 1/1997 | Lindeman | |
| 5,605,477 A | 2/1997 | Wu et al. | |
| 5,618,205 A | 4/1997 | Riddle et al. | |
| 5,620,340 A | 4/1997 | Andrews | |
| 5,624,268 A | 4/1997 | Maeda et al. | |
| 5,626,497 A | 5/1997 | Bouchan et al. | |
| 5,632,634 A | 5/1997 | Soes | |
| 5,633,615 A | 5/1997 | Quan | |
| 5,647,770 A | 7/1997 | Belopolsky | |
| 5,658,156 A | 8/1997 | Henderson et al. | |
| 5,661,901 A | 9/1997 | King | |
| 5,664,968 A | 9/1997 | Mickievicz | |
| 5,672,062 A | 9/1997 | Lindeman | |
| 5,674,093 A | 10/1997 | Vaden | |
| 5,675,302 A | 10/1997 | Howard et al. | |
| 5,697,817 A | 12/1997 | Bouchan et al. | |
| 5,699,228 A | 12/1997 | Lee | |
| 5,700,167 A | 12/1997 | Pharney et al. | |
| 5,702,258 A | 12/1997 | Provencher et al. | |
| 5,704,794 A | 1/1998 | Lindeman | |
| 5,704,795 A | 1/1998 | Lindeman | |
| 5,716,237 A | 2/1998 | Conorich et al. | |
| 5,743,765 A | 4/1998 | Andrews et al. | |
| 5,788,512 A | 8/1998 | Lindeman et al. | |
| 5,789,994 A | 8/1998 | Case et al. | |
| 5,791,947 A | 8/1998 | Crane, Jr. et al. | |
| 5,795,190 A | 8/1998 | Ono | |
| 5,795,191 A | 8/1998 | Preputnick et al. | |
| 5,816,826 A | 10/1998 | Colemen | |
| 5,823,795 A | 10/1998 | Schumacher | |
| 5,828,226 A | 10/1998 | Higgins et al. | |
| 5,842,873 A | 12/1998 | Gonzales | |
| RE36,065 E | 1/1999 | Andrews et al. | |
| 5,886,590 A | 3/1999 | Quan et al. | |
| 5,888,096 A | 3/1999 | Soes et al. | |
| 5,890,915 A | 4/1999 | Reylek | |
| 5,895,276 A | 4/1999 | Rothenberger | |
| 5,931,687 A | 8/1999 | McFarlane et al. | |
| 5,936,850 A * | 8/1999 | Takahashi et al. | 361/784 |
| 5,940,278 A | 8/1999 | Schumacher | |
| 5,949,656 A | 9/1999 | Pinault | |
| 5,955,889 A | 9/1999 | Taguchi et al. | |
| 5,961,355 A | 10/1999 | Morlion et al. | |
| 5,967,844 A | 10/1999 | Doutrich et al. | |
| 5,967,850 A | 10/1999 | Crane | |
| 5,967,853 A | 10/1999 | Hashim | |
| 5,980,321 A | 11/1999 | Cohen et al. | |
| 5,984,710 A | 11/1999 | Kodama | |
| 5,993,255 A | 11/1999 | Yurko | |
| 5,993,256 A | 11/1999 | Shimojyo | |
| 5,993,259 A | 11/1999 | Stokoe et al. | |
| 6,010,373 A | 1/2000 | Donahue | |

| Patent Number | Kind | Date | Inventor |
|---|---|---|---|
| 6,012,927 | A | 1/2000 | Longueville et al. |
| 6,039,580 | A | 3/2000 | Sciarretta et al. |
| 6,042,388 | A | 3/2000 | Tustaniwskyj et al. |
| 6,042,394 | A | 3/2000 | Mitra et al. |
| 6,046,410 | A | 4/2000 | Wojnarowski et al. |
| 6,050,842 | A | 4/2000 | Ferrill et al. |
| 6,062,870 | A | 5/2000 | Hopfer, III et al. |
| 6,083,047 | A | 7/2000 | Paagman |
| 6,123,554 | A | 9/2000 | Ortega et al. |
| 6,132,244 | A | 10/2000 | Leeman et al. |
| 6,146,202 | A | 11/2000 | Ramey et al. |
| 6,183,301 | B1 | 2/2001 | Paagman |
| 6,201,689 | B1 * | 3/2001 | Miyasyo .................... 361/681 |
| 6,220,896 | B1 | 4/2001 | Bertoncini et al. |
| 6,231,391 | B1 | 5/2001 | Ramey et al. |
| 6,234,807 | B1 | 5/2001 | Amini et al. |
| 6,236,287 | B1 | 5/2001 | Quan et al. |
| 6,238,245 | B1 | 5/2001 | Stokoe et al. |
| 6,247,972 | B1 | 6/2001 | Crane, Jr. et al. |
| 6,264,476 | B1 | 7/2001 | Li et al. |
| 6,280,201 | B1 | 8/2001 | Morris |
| 6,293,827 | B1 | 9/2001 | Stokoe |
| 6,305,947 | B1 | 10/2001 | Bruce |
| 6,307,391 | B1 | 10/2001 | Tustaniwskyj et al. |
| 6,316,719 | B1 | 11/2001 | Pluymers et al. |
| 6,343,955 | B1 | 2/2002 | Billman et al. |
| 6,347,962 | B1 | 2/2002 | Kline |
| 6,364,710 | B1 | 4/2002 | Billman et al. |
| 6,371,813 | B1 | 4/2002 | Ramey et al. |
| 6,379,188 | B1 | 4/2002 | Cohen et al. |
| 6,435,913 | B1 | 8/2002 | Billman |
| 6,439,894 | B1 | 8/2002 | Li |
| 6,461,197 | B1 | 10/2002 | Crane, Jr. et al. |
| 6,461,202 | B1 | 10/2002 | Kline |
| 6,471,548 | B1 | 10/2002 | Bertoncini et al. |
| 6,482,038 | B1 | 11/2002 | Olson |
| 6,491,545 | B1 | 12/2002 | Spiegel et al. |
| 6,503,103 | B1 | 1/2003 | Cohen et al. |
| 6,506,076 | B1 | 1/2003 | Cohen et al. |
| 6,524,135 | B1 | 2/2003 | Feldman et al. |
| 6,527,587 | B1 | 3/2003 | Ortega et al. |
| 6,527,588 | B1 | 3/2003 | Paagman |
| 6,540,558 | B1 | 4/2003 | Paagman |
| 6,551,140 | B1 | 4/2003 | Billman et al. |
| 6,554,647 | B1 | 4/2003 | Cohen et al. |
| 6,565,387 | B1 | 5/2003 | Cohen |
| 6,572,410 | B1 | 6/2003 | Volstorf et al. |
| 6,602,095 | B1 | 8/2003 | Astbury, Jr. et al. |
| 6,607,402 | B1 | 8/2003 | Cohen et al. |
| 6,623,310 | B1 | 9/2003 | Billman et al. |
| 6,652,319 | B1 | 11/2003 | Billman |
| 6,663,427 | B1 | 12/2003 | Billman et al. |
| 6,663,429 | B1 | 12/2003 | Korsunsky et al. |
| 6,743,057 | B1 | 6/2004 | Davis et al. |
| 6,773,267 | B1 * | 8/2004 | Harris et al. .................. 439/67 |
| 2001/0003077 | A1 | 6/2001 | Van Woensel |
| 2001/0005654 | A1 | 6/2001 | Cohen et al. |
| 2001/0012704 | A1 | 8/2001 | Eldridge |
| 2001/0012729 | A1 | 8/2001 | Van Woensel |
| 2001/0012730 | A1 | 8/2001 | Ramey et al. |
| 2001/0041477 | A1 | 11/2001 | Billman et al. |
| 2002/0025721 | A1 | 2/2002 | Bertoncini et al. |
| 2002/0049229 | A1 | 4/2002 | Yamamoto et al. |
| 2002/0081869 | A1 | 6/2002 | Abbott |
| 2002/0094705 | A1 | 7/2002 | Driscoll et al. |
| 2002/0102869 | A1 | 8/2002 | Ali et al. |
| 2002/0102885 | A1 | 8/2002 | Kline |
| 2002/0111068 | A1 | 8/2002 | Cohen et al. |
| 2002/0123266 | A1 | 9/2002 | Ramey et al. |
| 2002/0127893 | A1 | 9/2002 | Brodsky |
| 2002/0137400 | A1 | 9/2002 | Billman et al. |
| 2002/0168898 | A1 | 11/2002 | Billman et al. |
| 2002/0173175 | A1 | 11/2002 | Brodsky et al. |
| 2002/0187663 | A1 | 12/2002 | Li |
| 2003/0003803 | A1 | 1/2003 | Billman et al. |
| 2003/0143894 | A1 | 7/2003 | Kline et al. |
| 2003/0186594 | A1 | 10/2003 | Davis et al. |
| 2003/0220019 | A1 | 11/2003 | Billman et al. |
| 2003/0220021 | A1 | 11/2003 | Whiteman, Jr. et al. |
| 2005/0048842 | A1 | 3/2005 | Benham et al. |

FOREIGN PATENT DOCUMENTS

| | | |
|---|---|---|
| EP | 0 422 785 A2 | 4/1991 |
| EP | 0 442 643 A2 | 8/1991 |
| EP | 0 446 980 A1 | 9/1991 |
| EP | 0 488 482 A1 | 6/1992 |
| EP | 0583934 A2 | 2/1994 |
| EP | 0 654 859 A1 | 5/1995 |
| EP | 0 752 739 A1 | 1/1997 |
| EP | 1087466 A2 | 3/2001 |
| GB | 2 344471 A | 10/1999 |
| GB | 2344471 A | 6/2000 |
| GB | 2371686 A | 7/2002 |
| WO | WO 94/16474 | 7/1994 |
| WO | WO 97/02627 | 1/1997 |
| WO | WO/9718603 A1 | 5/1997 |
| WO | WO00/24092 A1 | 4/2000 |
| WO | WO 00/24092 A1 | 4/2000 |

* cited by examiner

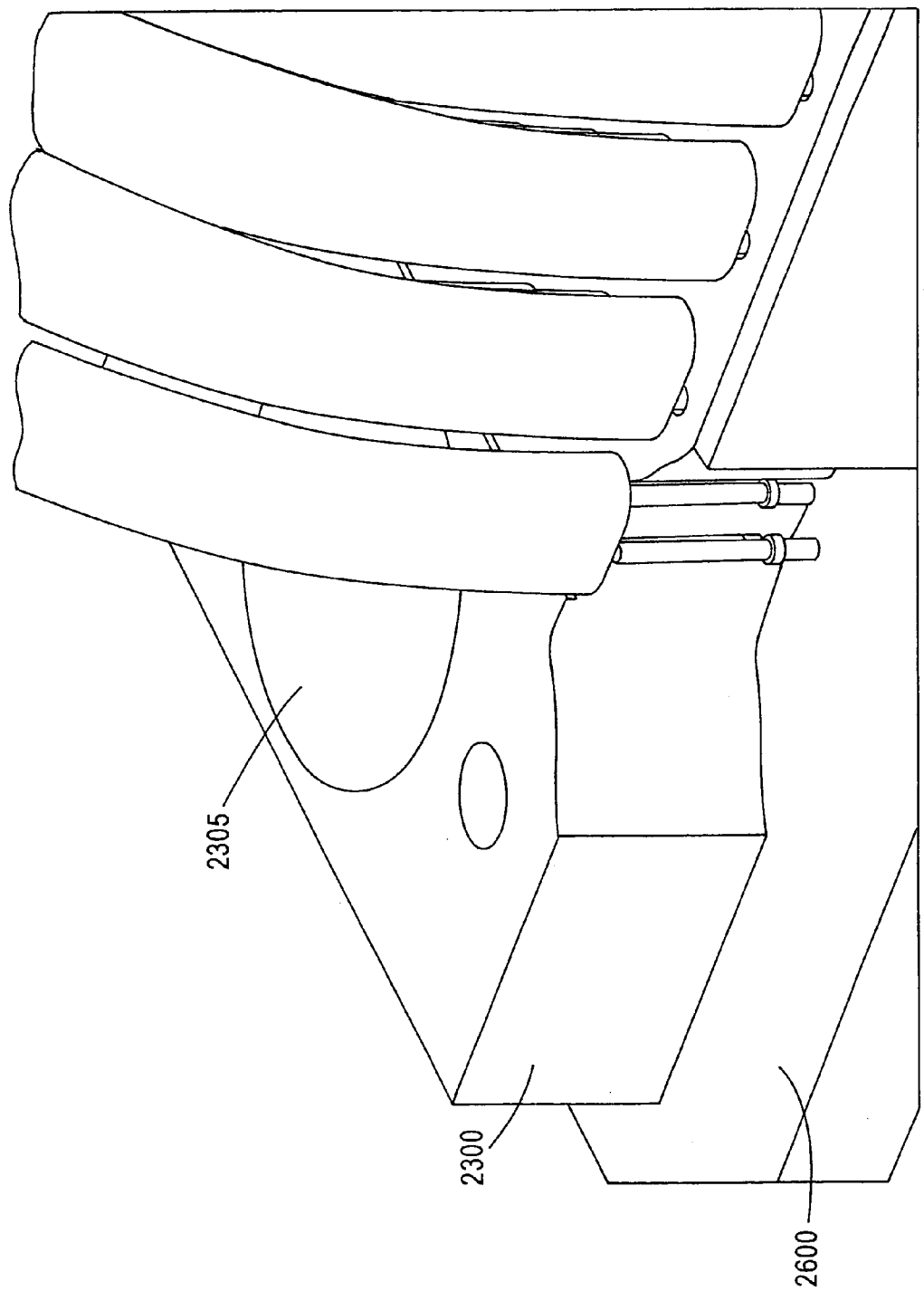

INTERCONNECTION SYSTEM

The present application is a Continuation of U.S. patent application Ser. No. 10/234,859, filed on Sep. 5, 2002, now U.S. Pat. No. 6,910,897 which is a Continuation-In-Part of U.S. patent application Ser. No. 10/036,796, filed on Jan. 7, 2002 (now U.S. Pat. No. 6,843,657), which claims the benefit of U.S. Provisional Patent Application No. 60/260,893 filed on Jan. 12, 2001 and U.S. Provisional Patent Application No. 60/328,396 filed on Oct. 12, 2001. The disclosures of these applications are hereby incorporated by reference in their entirety into the present specification.

BACKGROUND OF THE INVENTION

1. Field of the Invention

The present invention relates generally to electrical interconnection systems, and more particularly, to a high speed, high-density interconnection system for differential and single-ended transmission applications.

2. Description of the Related Art

Backplane systems are comprised of a complex printed circuit board that is referred to as the backplane or motherboard, and several smaller printed circuit boards which are referred to as daughtercards which plug into the backplane. Each of the daughtercards may include a chip that is referred to as a driver/receiver. The driver/receiver sends and receives signals from driver/receivers on other daughtercards. A signal path is formed between the driver/receiver on a first daughtercard and a driver/receiver on a second daughtercard. The signal path includes an electrical connector that connects the first daughtercard to the backplane, the backplane, a second electrical connector that connects the second daughtercard to the backplane, and the second daughtercard having the driver/receiver that receives the carried signal. Various driver/receivers being used today can transmit signals at data rates between 5–10 Gb/sec and greater. The limiting factor (data transfer rate) in the signal path is the electrical connectors which connect each daughtercard to the backplane. A need thus exists in the art for a high-speed electrical connector capable of handling the required high-speed transfer of data.

Further, the receivers are capable of receiving signals having only 5% of the original signal strength sent by the driver. This reduction in signal strength increases the importance of minimizing cross-talk between signal paths to avoid signal degradation or errors being introduced into digital data streams. With high speed, high-density electrical connectors, it is even more important to eliminate or reduce cross-talk. Thus, a need exists in the art for a high-speed electrical connector capable of handling high-speed signals that reduces cross-talk between signal paths.

There are various types of electrical connectors. One type is a through hole connector which could either be a compliant pin or through hole solder. Backplane systems have typically used connectors that consist of multiple contacts having pins that are inserted into the through hole contained in the printed circuit boards to be connected. The pins can be compliant fit or can be soldered in place. These require a relatively large diameter hole in the printed circuit board for receiving the pins of the connector. The larger the hole, the greater the probability of defects from plating and the greater the capacitance that reduces the signal speed which can be accommodated by these connectors. For example, plated through holes may not be properly plated and thus pins being inserted from the electrical connector can cause opens, shorts, etc. A plated through hole causes a capacitive effect which reduces the data rate which can be transferred through the pin and hole. Further, many contact type connectors are made from stamped parts that have varying geometries that increase signal reflection and reduce signal speed. Thus, it is advantageous to reduce the diameter of plated through holes using compression mount-type connectors that rely on a spring making contact with a pad on a board.

Many of these problems can be solved using a compression mount type electrical connector. This type of connector overcomes many of the deficiencies of the through hole contact type but compression mount connectors need bulky and expensive hardware to fasten the compression mount connector to the printed circuit board. Intimate contact needs to be maintained between compression mount contacts and the PC board surface without using additional fasteners such as jack screws.

Additionally, regardless of the type of electrical connector, the electrical connector has to be capable of being mated/unmated at least 250 and perhaps in excess of 1000 times. If the contacts wear, then contact resistance will increase. Contact wear can occur through metal-to-metal contact either through a point or line. For example, a certain area may continually get wiped as the connector is mated/unmated and the contact tends to wear through the metal sliding action can also cause wear. Also, some compression mount type connectors use dendrite contacts on flexible circuits. One difficulty with dendrite contacts is that these contacts tend to wear and are only good for a half a dozen mating cycles and the dendrites start to flatten out and the multiple points of contacts are lost thereby reducing reliability. Thus, a need exists for a compression mount-type connector that eliminates or reduces contact wear.

Another problem with prior art electrical connectors is that impedance changes over the length of the signal path reduce the potential signal speed. A need exists for an electrical connector in which impedance can be controlled at a specific value and where the specific value remains relatively constant over the length of the signal path.

In summary, electrical connectors used to electrically connect circuit boards such as backpanels to daughtercards suffer from several deficiencies including poor shielding resulting in electrical noise, changes in impedance and the inability to connect and disconnect many times without damage to the electrical connector. These deficiencies limit the data rate that can be transferred through the connector. Thus, a need exists in the art for a high-density electrical connector that overcomes the aforementioned problems to a large extent.

SUMMARY OF THE INVENTION

It is an object of the present invention to provide an electrical interconnection system capable of carrying signals at data rates between 5–10 Gb/sec or more.

Still another object of the present invention is to provide an electrical connector having a differential pair having constant impedance over the signal path and capable of carrying signals at between 5–10 Gb/sec or more.

Yet another of the present invention is to provide a coaxial cable connector having constant impedance over the signal path and capable of carrying signals at data rates between 5–10 Gb/sec or more.

Another object of the present invention is to provide an electrical connector in which cross-talk between signal paths of adjacent twinax cables or adjacent coaxial cables within the electrical connector is reduced and/or eliminated.

Yet another object of the present invention is to provide a compression type electrical connector using a conductive spring configuration.

The present invention is directed to a high-density electrical connector that can provide 40 or more twinax connections per linear inch in a 25 millimeter or less card slot. In a typical electronic system package, 20 millimeters is the spacing from center-line to center-line of the adjacent parallel daughtercards. Twinax cable is coaxial cable that contains two inner conducting wires rather than one. The two inner conducting wires provide two physical channels. Coaxial cable is called "coaxial" because it includes one physical channel that carries the signal surrounded (after a layer of insulation) by another concentric physical channel, both running along the same axis. The outer channel serves as ground.

These and other objects of the present invention may be achieved by providing an interconnection system comprising: a plurality of spacers arranged to be disposed adjacent each other in a row having two ends, each spacer including at least one groove arranged to allow a cable section to be disposed therein upon said spacer being disposed adjacent to another of said plurality of spacers; a plurality of cable sections respectively disposed within said grooves of said plurality of spacers, each cable section having first and second ends and at least one center conductor and an outer conductive shield, and said grooves of said plurality of spacers being arranged so as to leave exposed, on a first plane, all of said first ends of said plurality of cable sections and so as to leave exposed, on a second plane, all of said second ends of said plurality of cable sections; a pair of end pieces respectively arranged to be disposed adjacent said to ends of said row of plurality of spacers; first and second interposers respectively arranged to be disposed adjacent said first and second planes, each interposer having an aperture for each center conductor of said plurality of cable sections and having at least one aperture for each outer conductive shield of said plurality of cable sections; and a plurality of electrically conductive contacts, each electrically conductive contact having first and second ends and being arranged to be respectively disposed in one of said apertures of said first and second interposers, wherein said first end of each of said plurality of electrically conductive contacts respectively makes electrical contact with one of said plurality of cable sections and wherein said second end of each of said plurality of electrically conductive contacts extends through its respective aperture in its respective interposer beyond a plane of said interposer.

These and other objects of the present invention may also be achieved by providing a method of manufacturing an interconnection system, the method comprising: disposing a plurality of spacers adjacent each other in a row having two ends; arranging each spacer to include at least one groove to allow a cable section to be disposed therein upon said spacer being disposed adjacent to another of said plurality of spacers; respectively disposing a plurality of cable sections within said grooves of said plurality of spacers, each cable section having first and second ends and at least one center conductor and an outer conductive shield; arranging said grooves of said plurality of spacers so as to leave exposed, on a first plane, all of said first ends of said plurality of cable sections and so as to leave exposed, on a second plane, all of said second ends of said plurality of cable sections; respectively disposing a pair of end pieces adjacent said to ends of said row of plurality of spacers; respectively disposing first and second interposers adjacent said first and second planes, each interposer having an aperture for each center conductor of said plurality of cable sections and having at least one aperture for each outer conductive shield of said plurality of cable sections; and respectively disposing a plurality of electrically conductive contacts, each electrically conductive contact having first and second ends, in one of said apertures of said first and second interposers; wherein said first end of each of said plurality of electrically conductive contacts respectively makes electrical contact with one of said plurality of cable sections; and wherein said second end of each of said plurality of electrically conductive contacts extends through its respective aperture in its respective interposer beyond a plane of said interposer.

Still furthermore, these and other objects of the present invention may be achieved by providing an interconnection system comprising: a plurality of spacers arranged adjacent each other in a row; a plurality of cable sections, each of said plurality of cable sections having at least one center conductor and an outer conductive shield and each of said cable sections being disposed within at least one of said plurality of spacers, and all of said plurality of cable sections having one end exposed on a first plane and a second end exposed on a second plane; a pair of interposers having apertures disposed therein, said pair of interposers being respectively disposed on faces of said plurality of spacers; and electrically conductive contacts respectively disposed within said apertures in said pair of interposers so as to have one end making electrical contact with one of said cable sections and another end extending through its respective aperture in its respective interposer.

Lastly, these and other objects of the present invention may be achieved by providing a method of manufacturing an interconnection system, the method comprising: arranging a plurality of spacers adjacent each other in a row; disposing each one of a plurality of cable sections within at least one of said plurality of spacers, each of said plurality of cable sections having at least one center conductor and an outer conductive shield and all of said plurality of cable sections having one end exposed on a first plane and a second end exposed on a second plane; respectively disposing a pair of interposers on faces of said plurality of spacers, each of said pair of interposers having apertures disposed therein; and respectively disposing electrically conductive contacts within said apertures in said pair of interposers so as to have one end making electrical contact with one of said cable sections and another end extending through its respective aperture in its respective interposer.

In the present invention, each of said electrically conductive contacts may comprise a spring contact disposed within a top hat, an exposed end of said spring contact comprising said first end of said respective electrically conductive contact and a closed end of said top hat comprising said second end of said electrically conductive contact and each top hat may include a shoulder portion in a plane perpendicular to an axis thereof.

Furthermore, in the present invention, each of said electrically conductive contacts may comprise a one-piece semi-rigid spring contact having first and second ends, said first end of said spring contact comprising said first end of said respective electrically conductive contact and said second end of said spring contact comprising said second end of said electrically conductive contact, each spring contact includes a shoulder portion in a plane perpendicular to an axis thereof and each cable section may comprise two center conductors.

Lastly, in the present invention, each interposer may have two apertures for each outer conductive shield of said plurality of cable sections and an exposed respective end of said at least one center conductor and an outer conductive shield of said first end and said second end of each cable section may be in one plane.

Still other advantages of the present invention will become readily apparent to those skilled in the art from the following detailed description, wherein embodiments of the invention are shown and described, simply by way of illustration. As will be realized, the invention is capable of other and different embodiments, and its several details are capable of modifications in various respects, all without departing from spirit and scope of the present invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein:

FIG. 22 is a view corresponding to that of FIG. 21 but with all of the twinax cables being arranged with their respective spring contacts and top hats.

DETAILED DESCRIPTION OF THE INVENTION

The interconnect arrangement according to the present invention provides a unique twin axial shielded coax structure that has constant impedance from daughtercard interface to the backplane interface. The coaxial structure provides for constant impedance of 65 ohms single ended impedance, 50 ohms odd mode impedance and 100 ohms differential impedance. Advantageously, the present invention provides a controlled impedance connector through the ability to change the characteristic impedance of the electrical connector by changing the dielectric thickness and constant. This allows custom connectors to be made at different impedance values ranging from 35 ohms to 150 ohms or higher.

A single ended interconnect path utilizes one conductor to transfer data. A differential interconnect path utilizes two conductors to transmit the same data. The benefit of a differential interconnect path relative to a single ended interconnect path is that transmission speed increases and noise immunity and electromagnetic interference (EMI) concerns are reduced.

Utilizing the twinax design according to the present invention, the connector design described herein will provide the best known practice for transmitting differential data utilizing copper conductors. The same is true for the single ended version. The single ended design utilizes a coaxial conductor to transmit data. This makes it possible to transmit analog (RF) or digital data with signal degradation comparable to that of a coaxial cable.

Figure 1A:
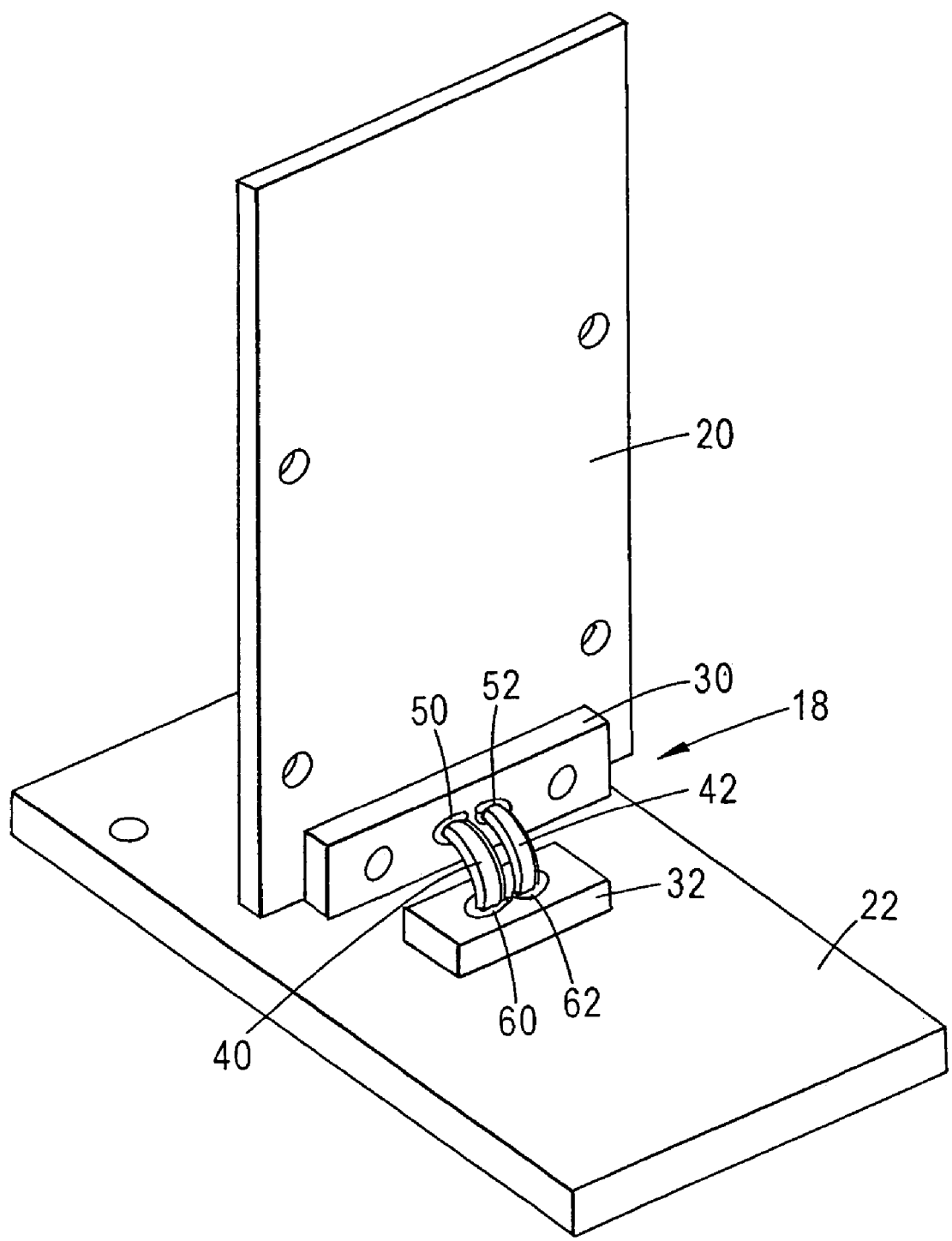
FIG. 1A is a perspective view of an electrical connector according to an embodiment in accordance with the invention disclosed in the parent application mounted to a daughtercard and a backplane with an over-mold omitted for clarity.
Figure 1B:
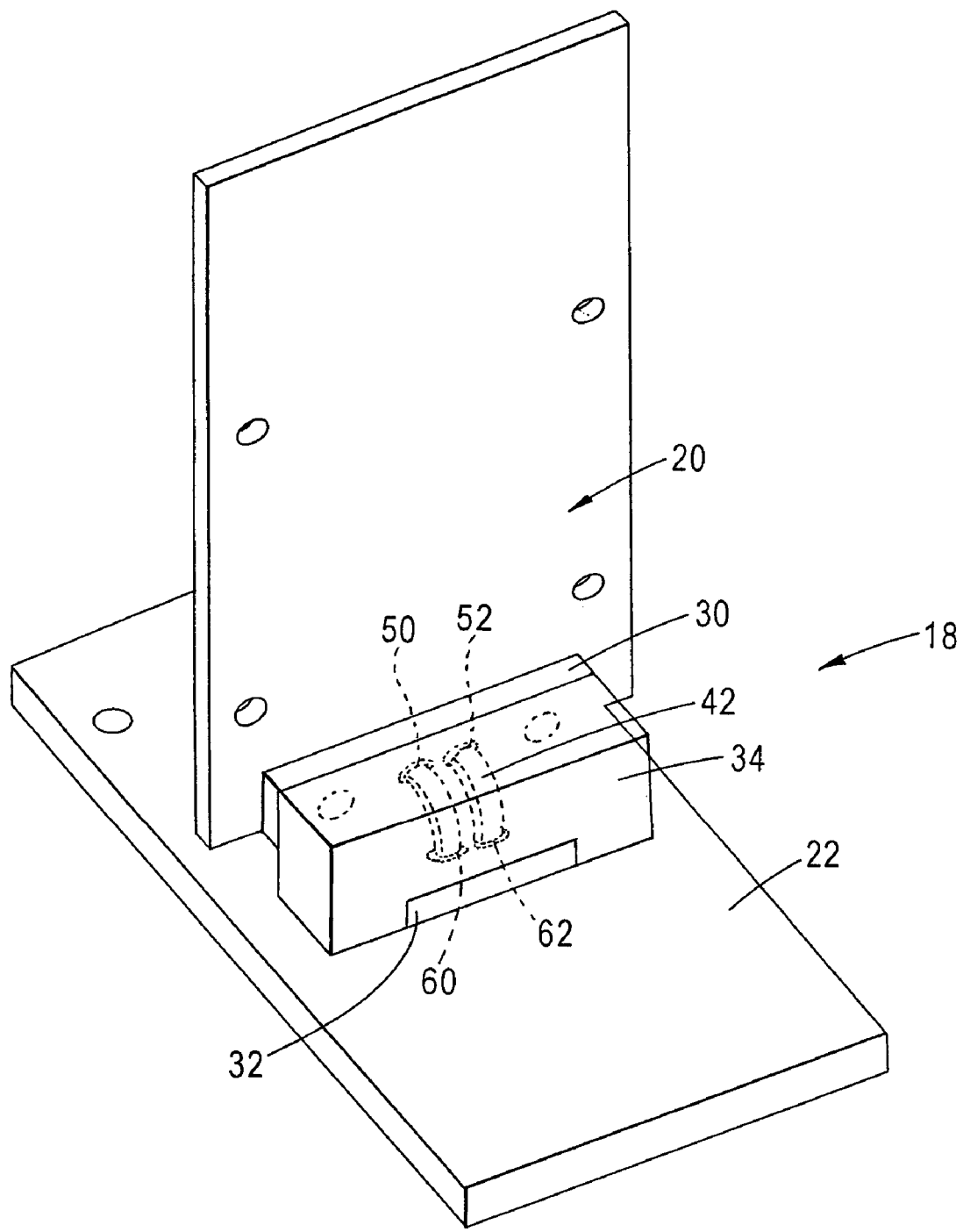
FIG. 1B is the same view as FIG. 1A with the over-mold depicted.

Refer first to FIGS. 1A and 1B where an interconnect system for a high speed, high density interconnect path is illustrated. FIG. 1A shows the electrical connector with the over-mold omitted for simplicity of explanation. The connector 18 is used to electrically connect daughtercard 20 to a backpanel 22. The connector 18 includes, as depicted in FIG. 1B, a daughtercard interposer 30, a backpanel interposer 32, an over-mold 34 which over-molds semi-rigid twinax or coax cables. The over-mold 34 is preferably injection molded, for example, from PBT (polybutylene terephthalate). As depicted in FIGS. 1A and 1B, only two twinax cables 40, 42 are shown for ease of illustration, although it is anticipated that 80 pairs or more of twinax may be used in the electrical connector. This embodiment uses twinax cable that is bent into a desired shape. A more rigid construction that is molded in a single piece may also be used. For the cables 40 and 42, the center conductor is copper, the dielectric material may be Teflon.TM. and the outside jacket may be a braid. Preferably, the differential impedance between center conductors is approximately 100 ohms. Using standard formulas, the impedance can easily be adjusted by varying the distance between center conductors and the dielectric constant for example. In FIG. 1A, the over-mold 34 is omitted for clarity. As depicted in FIGS. 1A and 1B, spring contact arrangements 50, 52, 60, 62 are positioned within the interposers 30 and 32, respectively, and surround ends of the twinax cables 40 and 42 in order to shield the twinax cables and control the impedance of the connector.

Spring contacts and the uses thereof are explained in U.S. Pat. No. 4,998,306, issued Jan. 29, 1991, entitled "LOW-LOSS ELECTRICAL INTERCONNECTS", U.S. Pat. No. 5,886,590, issued Mar. 23, 1999, entitled "MICROSTRIP TO COAX VERTICAL LAUNCHER USING FUZZ BUTTON AND SOLDERLESS INTERCONNECTS", U.S. Pat. No. 6,039,580, issued Mar. 21, 2000, entitled "RF CONNECTOR HAVING A COMPLIANT CONTACT", U.S. Pat. No. 4,924,918, issued May 15, 1990, entitled "MACHINE FOR MANUFCTURING BUTTON CONNECTOR AND METHOD THEREFOR", and U.S. Pat. No. 5,007,843, issued Apr. 16, 1991, entitled "HIGH-DENSITY CONTACT AREA ELECTRICAL CONNECTORS", all of which are hereby incorporated by reference in their entirety into the present specification. Although the present invention described herein is described with respect to the illustrated type of spring contacts, it should be understood that they are an illustrative type of conductive element or contact and that other types of electrically conductive elements or springs can be used with the present invention. The conductive element provides high reliability, multiple points of contact and is randomly compressed into a shape that provides multiple electrical contact points to a mating surface.

The conductive element may take various suitable forms. For example, the conductive element may include a "watch band" or POGO" pin, that is, at least one spring-loaded pin capable of being compressed. In a further alternative, the conductive element may include a bellows device comprising a plurality of deformable folds that are compressible. A further suitable conductive element comprises a conductor formed into a plug-shaped compressible mesh. Alternatively, the conductive element may include Belleville washers or an element comprised of an elastomer loaded with conductive particles. Preferably, the conductive element is plated with gold in order to ensure low, stable RF losses in benign or adverse environments.

The conductive element may comprise a single element as described above, or other types suitable for providing at least one compliant end or, alternatively, may comprise more than one element, in which case at least one of the elements has at least one compliant end.

Although a right angle connector 18 is illustrated, it should be understood that other configurations, such as straight configurations between parallel circuit boards, are possible. Also, although the following discussion is with respect to daughtercards and backpanels, this is only done for convenience and it should be understood that the electrical connector discussed below is usable for connecting all types of circuit boards as well as in other high speed applications.

As illustrated in FIGS. 1A and 1B, the connector 18 would be assembled by connecting interposer 30 and the backpanel interposer 32. As depicted in FIG. 1B, the connector 18 is assembled as follows. First, the twinax cables 40, 42 are formed. All of the spring contacts are installed into interposers 30 and 32. The twinax cables 40 and 42 are then installed into the interposers 30 and 32. The assembly is then insert molded to form the over-mold 34 that makes the entire electrical connector 18 rigid. The over-mold 34 is preferably PBT. The electrical connector 18 could then be connected to the daughtercard 20 using fasteners such as screws, rivets, compression posts, and the like.

The spring connectors 50, 52, 60, and 62 can be made from a single gold plated fine wire that is compressed into a very small shape. The resulting object is a wire mass having spring performance and demonstrates superior electrical signal conduction from high current DC to microwave frequencies. The typical size of such a spring contact is 0.01 inch in diameter by 0.060 in length. The signal carrying spring contacts preferably have the same outer diameter as the signal carrying center cable. The ground contact spring contacts do not have to be the same diameter or length as the signal carrying spring contacts. The spring contacts 50, 52, 60, and 62 are employed in the illustrative embodiments, preferably each formed from a strand of metal wire, each strand being wadded together to form a desired cylindrically shaped "button" of material having a density of between 20% and 30%. As depicted in FIGS. 1A and 1B, each wadded-wire connected spring contact fits snuggly in openings of the daughtercard interposer 30 and the backpanel interposer 32. Each wadded-wire spring contact 50, 52, 60, and 62 makes electrical contact at multiple points when compressed against the contact area. Connectors of this type have significant advantages over other types of connectors and provide connections of high integrity and reliability. In contrast to other types of connections, this mechanical connector element has very few associated variables that can affect the quality of the connection. The only significant variables are the size of the connector element and the compressive force used to make the connection, both of which can be accurately controlled by controlling the volume into which the spring contact is placed. Alternatively, in high vibration environments, the spring contact can be affixed in place using a conductive epoxy.

The spring contacts employed in the illustrative embodiments can be fabricated using nickel wire, or wire made from alloys such as beryllium and copper, silver and copper, or phosphorous and bronze. The compression of the wadded wire of the spring contacts is substantially elastic so that, when the compressive force of the twinax cables is removed, the spring contacts return to their original shape. The wire is randomly compressed into a cylindrical shape and the wire has some spring constant associated with it to provide resiliency when pressure is applied. Advantageously, this allows the electrical connector 18 to be connected and disconnected as many times as is needed. In the embodiments described above, the wadded-wire connector elements 50, 52, 60, and 62 can comprise components manufactured by Technical Wire Products, Inc. of Piscataway, N.J., under the trademark Fuzz Button™.

Figure 2:
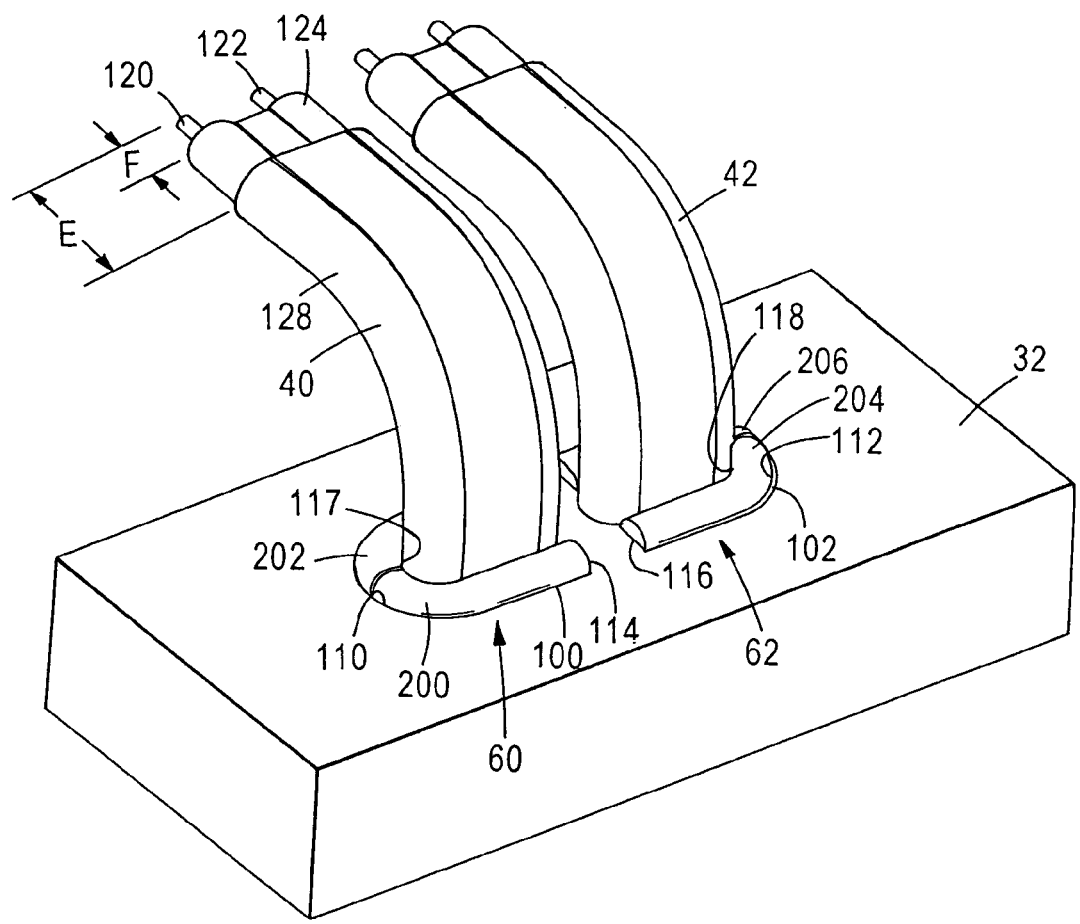
FIG. 2 is a perspective view of the electrical connector according to an embodiment in accordance with the invention disclosed in the parent application with the semi-rigid twinax connected to the back panel interposer only and with the backpanel and over-mold omitted for clarity.

Referring now to FIG. 2, the twinax cables 40 and 42 are inserted into the backpanel interposer 32. FIG. 2 differs from FIG. 1 in that two twinax cables 40 and 42 are depicted instead of one. It is important to note that central conductors 120 and 122 are not shielded from each other. However, it is important to shield twinax pairs from each other as depicted in FIG. 2.

As depicted in FIG. 2, the backpanel interposer 32 has two opposed U-shaped openings 100 and 102 each respectively having an outer U-shaped peripheral wall 110 and 112, an inner U-shaped peripheral wall 117 and 118 and a straight wall 114 and 116, respectively. Walls 114 and 116 face each other as depicted in FIG. 2. Inserted into the U-shaped openings are a plurality spring contacts 200, 202, 204, and 206, respectively, each being in a half U-shape as depicted in FIG. 2. For example, spring contacts 200 and 202 each have a half U-shape and when placed together form a U partially surrounding the twinax cable 40. It should be understood that other shielding methods could be used to replace the spring contacts.

The twinax cable 40 has two central conductors 120 and 122 surrounded by Teflon.TM. sheathing 124, for example. Preferably, signal carrying spring contacts 300–306 (see FIG. 3) have the same outer diameters as the two central conductors 120, 122. The Teflon.TM. sheathing 124 may be covered by an electrically conductive copper layer or by a rigid or semi-rigid outer case 128 made of copper and aluminum or a tin filled braiding. Case 128 may be formed using a plating process. As depicted in FIG. 2, the rigid outer case 128 is stripped away to a length E, thereby exposing the Teflon.TM. sheathing 124. The Teflon.TM. sheathing 124 is stripped away from the central conductor to a length F. This stripping is done symmetrically on both ends of twinax cables 40 and 42. The spring contacts 200, 202, 204, and 206 are in electrical contact with the layer 128 so as to form a shield.

Figure 3:
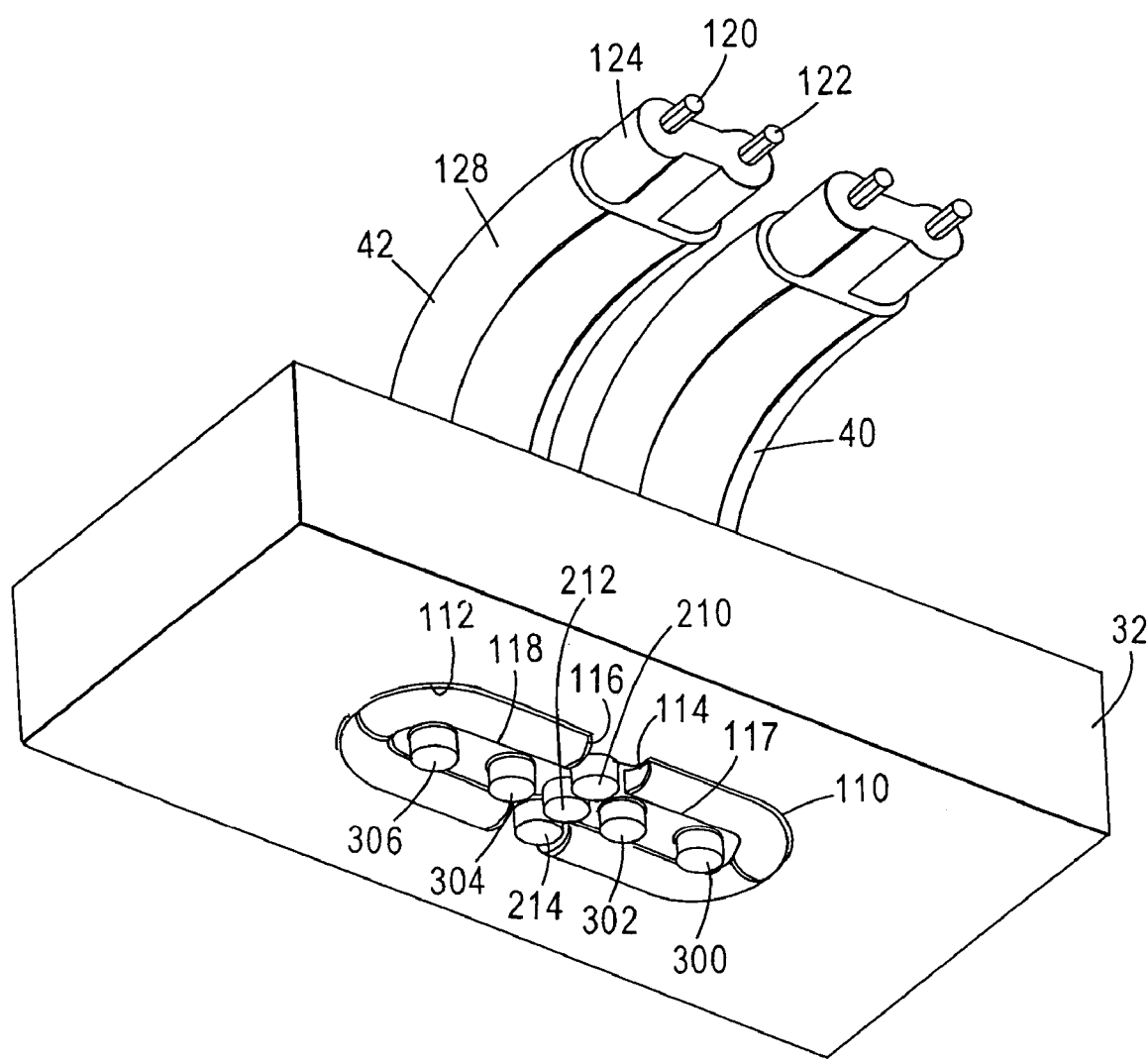
FIG. 3 is a bottom perspective view of FIG. 2.

Refer now to FIG. 3 that depicts a bottom view of FIG. 2. Mounted within the interposer 32 are spring contacts stacked one upon another in a half U-configuration through the thickness of interposer 32 for surrounding and shielding the central twinax leads 120 and 122, respectively, of twinax cables 40 and 42. Also depicted are a plurality of vertically extending cylindrical spring contacts 210, 212, and 214 that are positioned between walls 114 and 116. The spring contacts 210 and 214 extend through the thickness of interposer 32 and are used to shield twinax cables 40 and 42 from each other. As depicted in FIG. 3, it should be understood that there is a full 360. degree shielding for twinax cables 40 and 42 for the stripped away portions of coax cables 40 and 42 that extend through the interposer 32. As depicted in FIG. 3, there are four spring contacts 300, 302, 304, and 306 in contact with the exposed portions of central conductors 120 and 122 of twinax cables 40 and 42.

Figure 4:
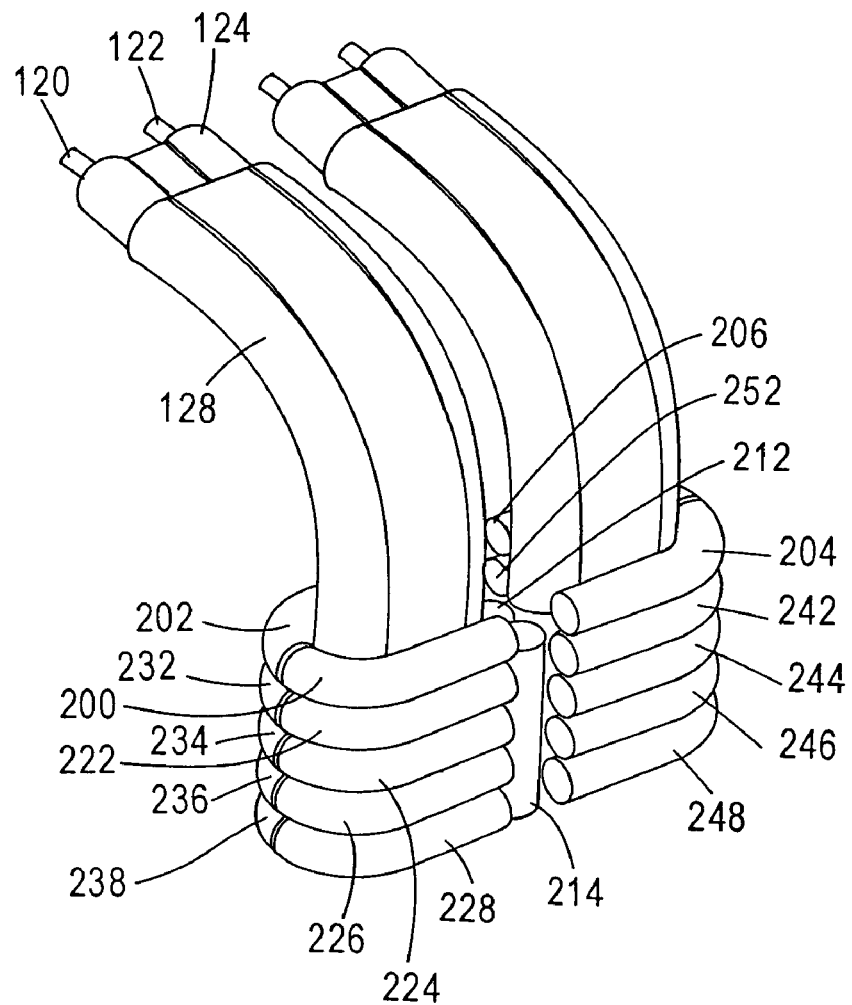
FIG. 4 is the same view as FIG. 2 with the back panel interposer omitted for clarity.

FIG. 4 is an illustration similar to FIGS. 2 and 3 in which the daughtercard interposer 32 has been omitted for clarity. As is evident in FIG. 4, there are four stacks of half U-shaped spring contacts 200, 222, 224, 226, 228; 202, 232, 234, 236, 238; and 204, 242, 244, 246, 248, 206, 252, 254, 256, and 258 (not shown). These four stacks together with the vertically extending spring contacts form a full 360. degree shield around twinax cables 40 and 42. It is envisioned that the uppermost and lowermost spring contacts will be used. However, it is possible to use structures other than spring contacts to electrically connect the uppermost and the lowermost spring contacts. For example, a stamped and formed metal component (not shown) can be used to electrically connect the uppermost and the lowermost spring contacts.

Figure 5:
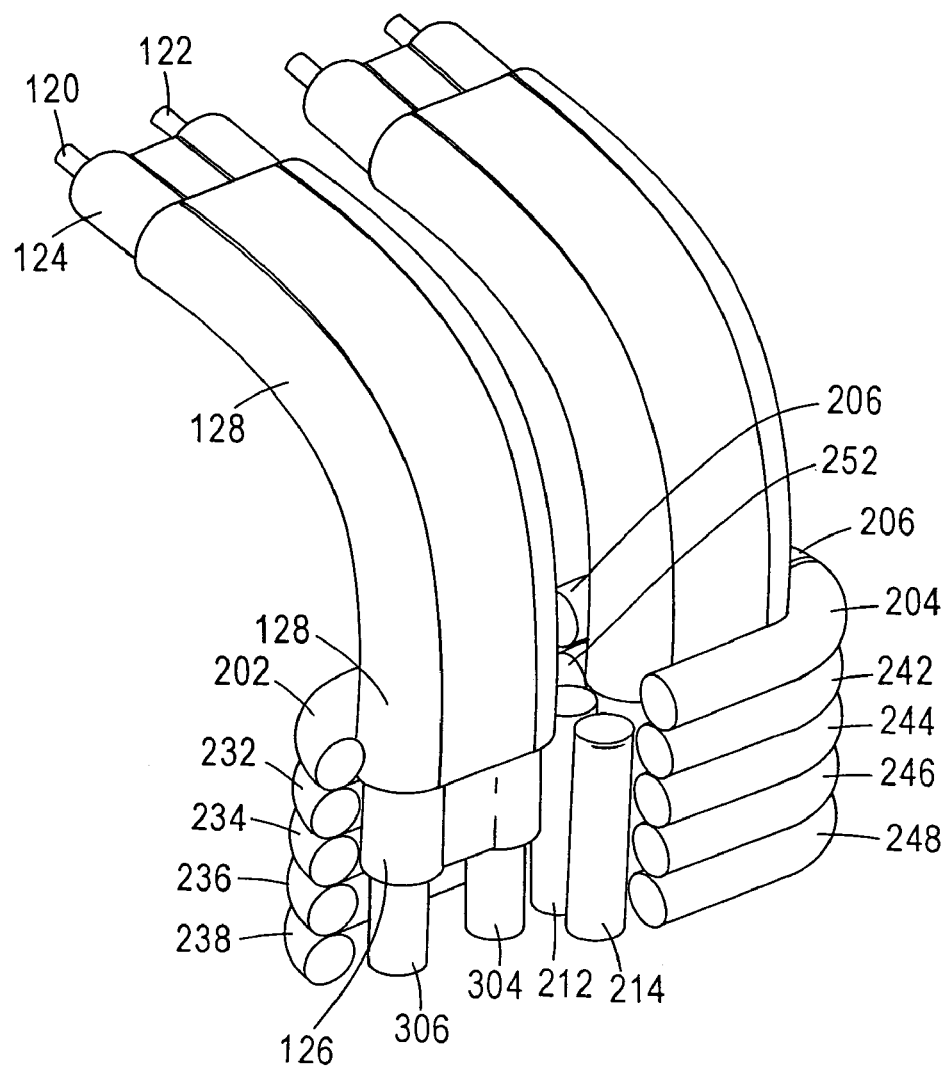
FIG. 5 is the same view as FIG. 4 with some of the spring contacts omitted for clarity.

FIG. 5 is similar to FIG. 4 except that spring contacts 200, 222, 224, 226 and 228 have been omitted to show spring contacts 306, and 304 respectively in contact with central conductors 122 and 120.

Figure 6:
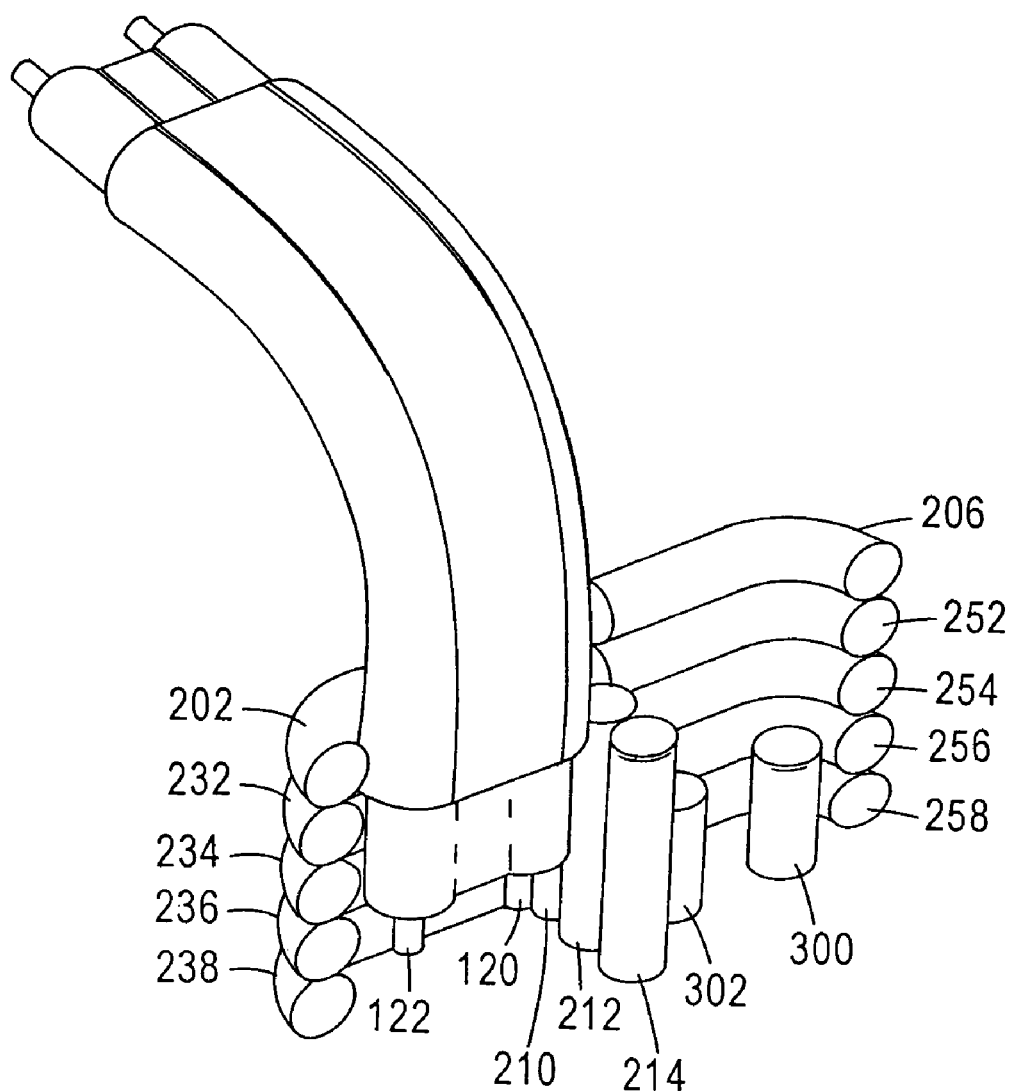
FIG. 6 is the same view as FIG. 5 with additional spring contacts omitted for clarity.

As depicted in FIG. 6, it can be seen that spring contacts 300 and 302 and also 304 and 306 (not shown) contact the exposed portions of the central signal carriers 120 and 122. These spring contacts 300–306 are the signal carrying spring contacts. It is important that the signal carrying spring contacts are substantially the same diameter as the twinax central conductors 120 and 122 to maintain constant impedance. It is also envisioned that other types of spring contacts could be used in the present invention. For example, conductive textiles may be used. Compression springs could also be used. The conductive textile may be injected into the connector replacing the spring contacts.

Figure 7:
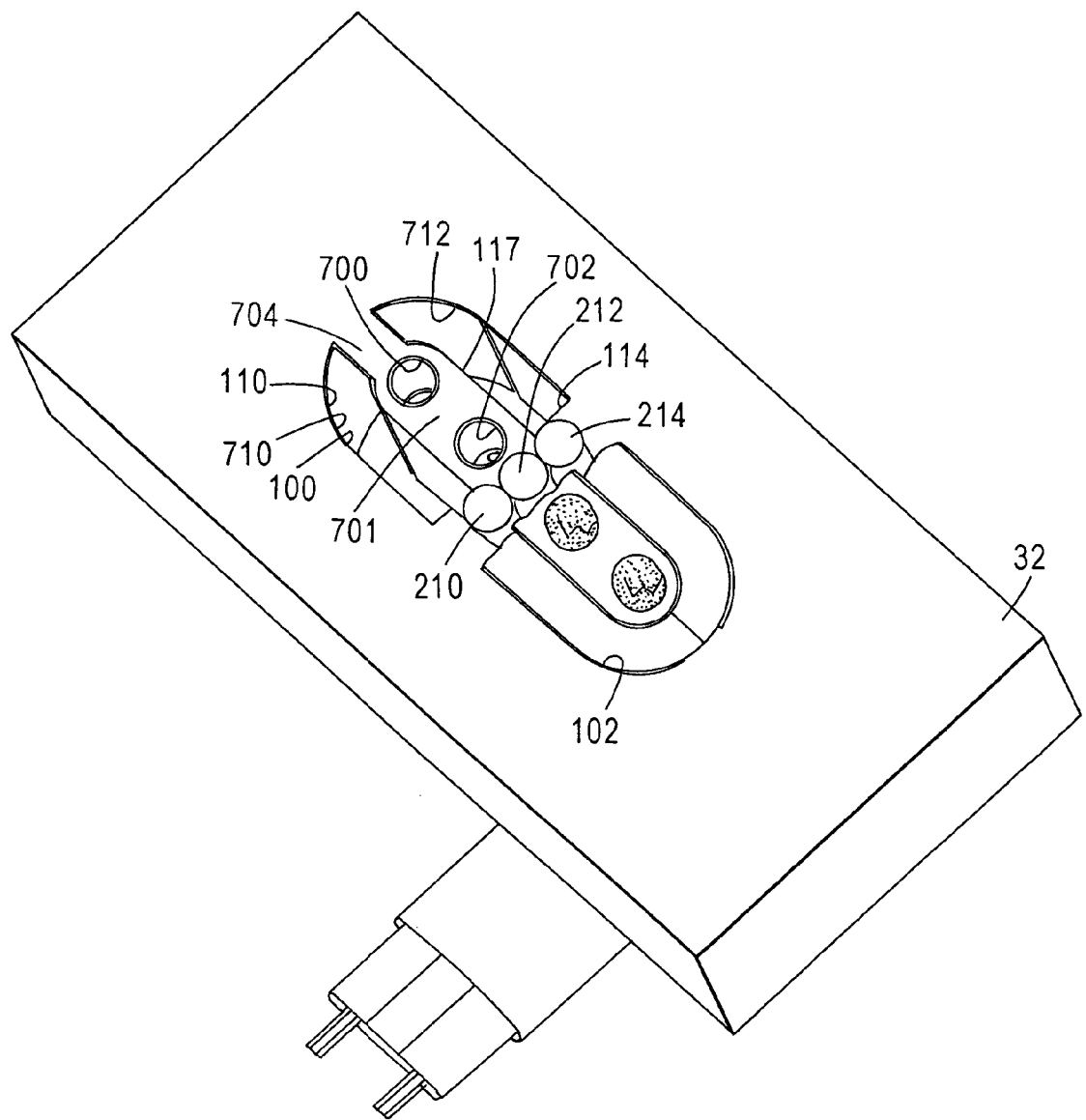
FIG. 7 is a bottom perspective view with the spring contacts omitted for clarity.

Refer now to FIG. 7 where a bottom perspective view of the electrical connector 18 is depicted. As depicted in FIG. 7, a central portion 701 is formed between the straight wall 114 and the bottom of the outer U-shaped wall 110. The central portion 701 includes through holes 700 and 702 that receive vertically extending spring contacts 300 and 302. A wall 704 is formed centrally in the U-shaped area to form a first half U-shaped opening 710 and a second U-shaped opening 712 which respectively receive spring contacts 206, 252, 254, 256, and 258 and 204, 242, 244, 246, and 248. It is envisioned that there could be a two-piece construction and the center support structure could be a separate member constructed of a Teflon.TM. dielectric. Also, metal plated plastic components could be used.

Figure 8:
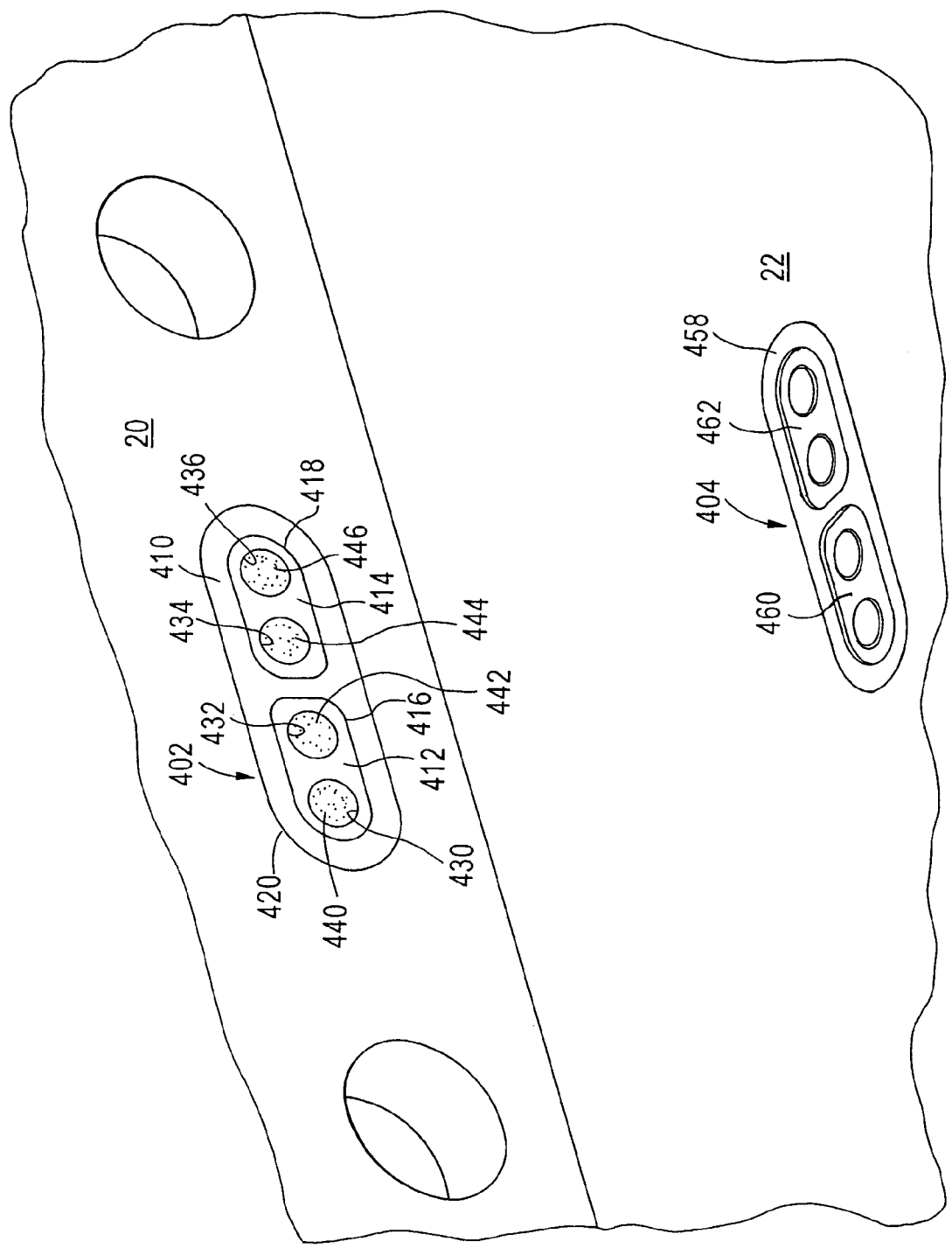
FIG. 8 is a perspective view of the daughtercard and backpanel including PC board patterns.

As depicted in FIG. 8, a plurality of electrically non-conductive patterns 402 and 404 are on the daughtercard 20 and the backpanel 22, respectively. The pattern 402 has an electrically conductive area 410 having roughly a figure eight configuration. The patterns can be formed using known photolithographic techniques. A first non-conductive area 412 and a second non-conductive area 414 are spaced apart from each and within an outer periphery 420 of the pattern 402. The first non-conductive area 412 has two areas 430 and 432 that include conductive pads 440 and 442. The second non-conductive area 414 has two areas 434 and 436 that include conductive pads 444 and 446. Openings 430, 432, 434, and 436 receive the center conductors 120 and 122 of twinax cables 40 and 42 that extend from the interposer 30 such that spring contacts 300, 302, 304, and 306 are respectively brought into contact with the conductive pads 440, 442, 444, and 446. Referring back to FIG. 4, spring contacts 228, 238, 248 and 258 will be in electrical contact with the electrically conductive area 410. In this manner, the spring contacts provide a shielding path to ground. The electrically conductive area 410 is connected to ground plane on the daughtercard and on the backplane. The inner surfaces of openings 430, 432, 434, and 436 are electrically conductive and are connected to signal paths so that spring contacts 306, 304, 302, and 300 are in electrical contact therewith when the interposer 30 is used to connect the daughtercard 20 and the backpanel 22. Spring contacts are mounted in the interposer 32. Advantageously, the spring contacts 300, 302, 304, and 306 will be compressed when the daughtercard and backpanel are mated which provides a normal force on the signal line and on the cable. The spring contacts 300, 302, 304, and 306 and 228, 238, 248, and 258 will be compressed to the board 20 maintaining normal forces with respect to the daughtercard pattern 402. The pattern 404 on the backpanel 22 is the same as the pattern 402 and need not be described in detail herein. The pattern 404 includes an electrically conductive portion 458 and a first non-conductive area 460 and a second non-conductive area 462. Advantageously, the electrical connector 18 can be connected and reconnected multiple times without degrading the signal contacts 300, 302.

Figure 9:
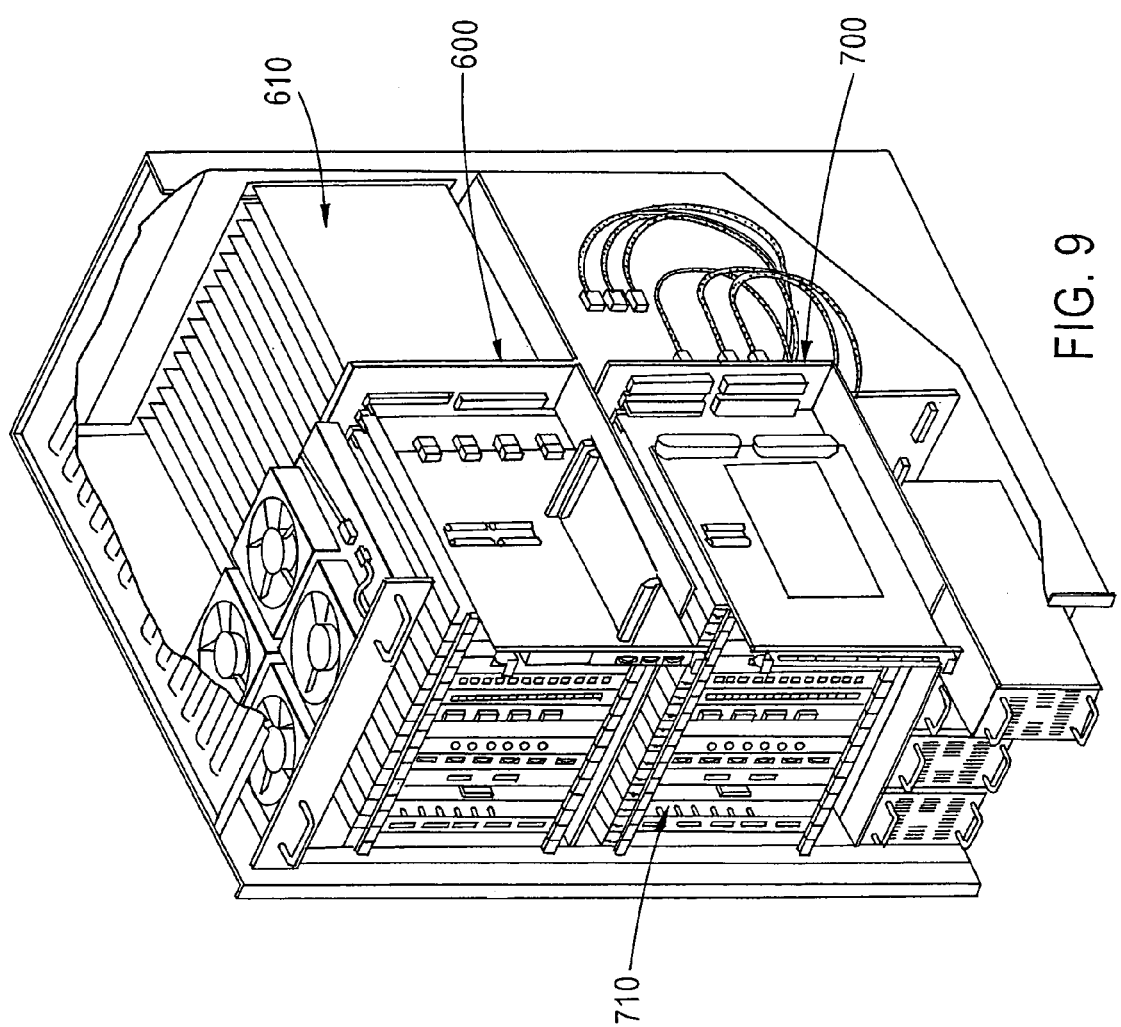
FIG. 9 illustrates a backpanel, mid-panel and daughtercard in an actual application.

Refer now to FIG. 9 where a backpanel 700 is depicted connected to a daughtercard 710. Such an arrangement is also usable in mid-plane connectors such as mid-plane connector 600 depicted in FIG. 9 that is connected to a daughtercard 610.

Figure 10:
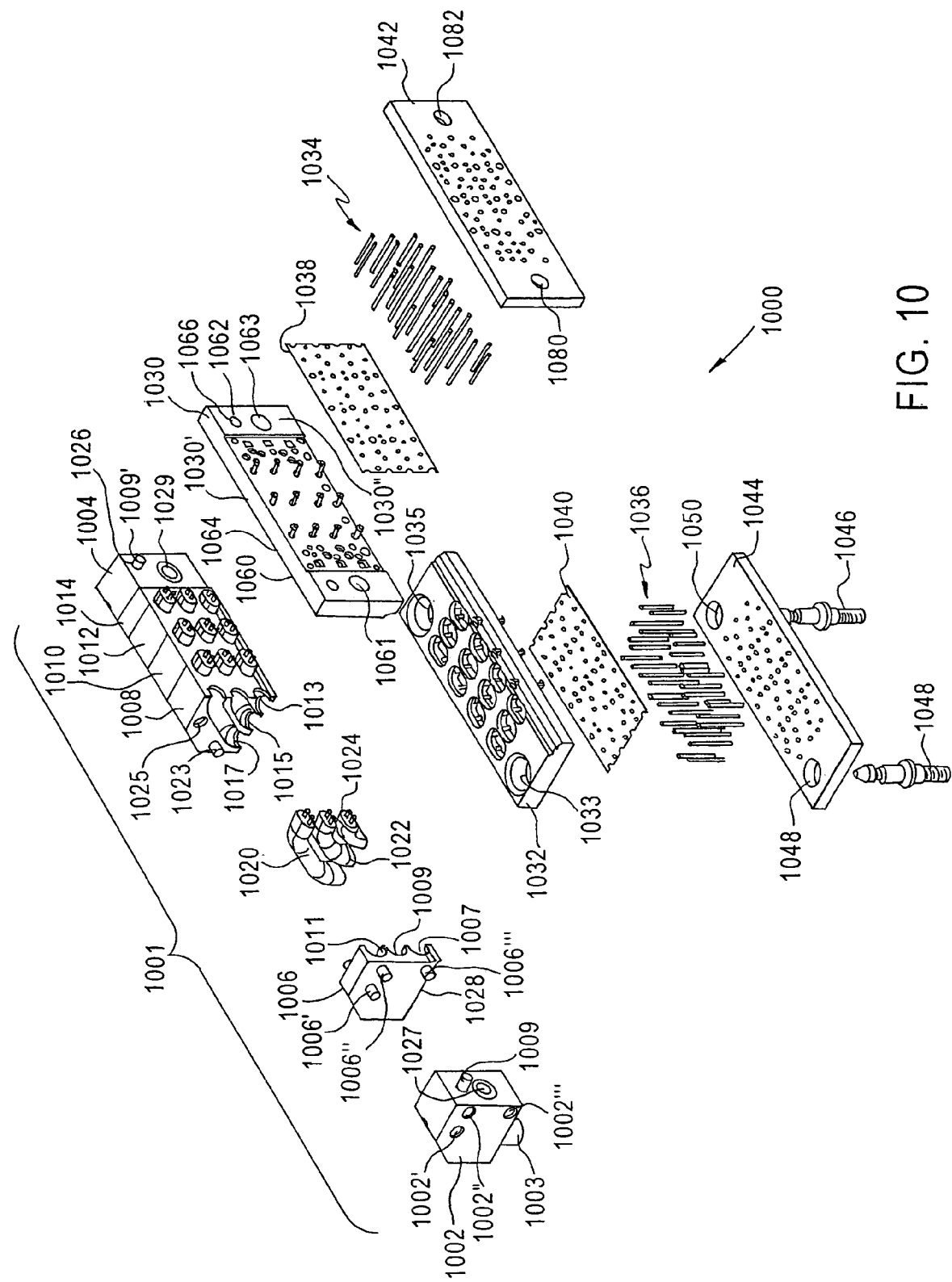
FIG. 10 is an exploded view of a second embodiment of an electrical connector according to the principles of the invention disclosed in the parent application.
Figure 11:
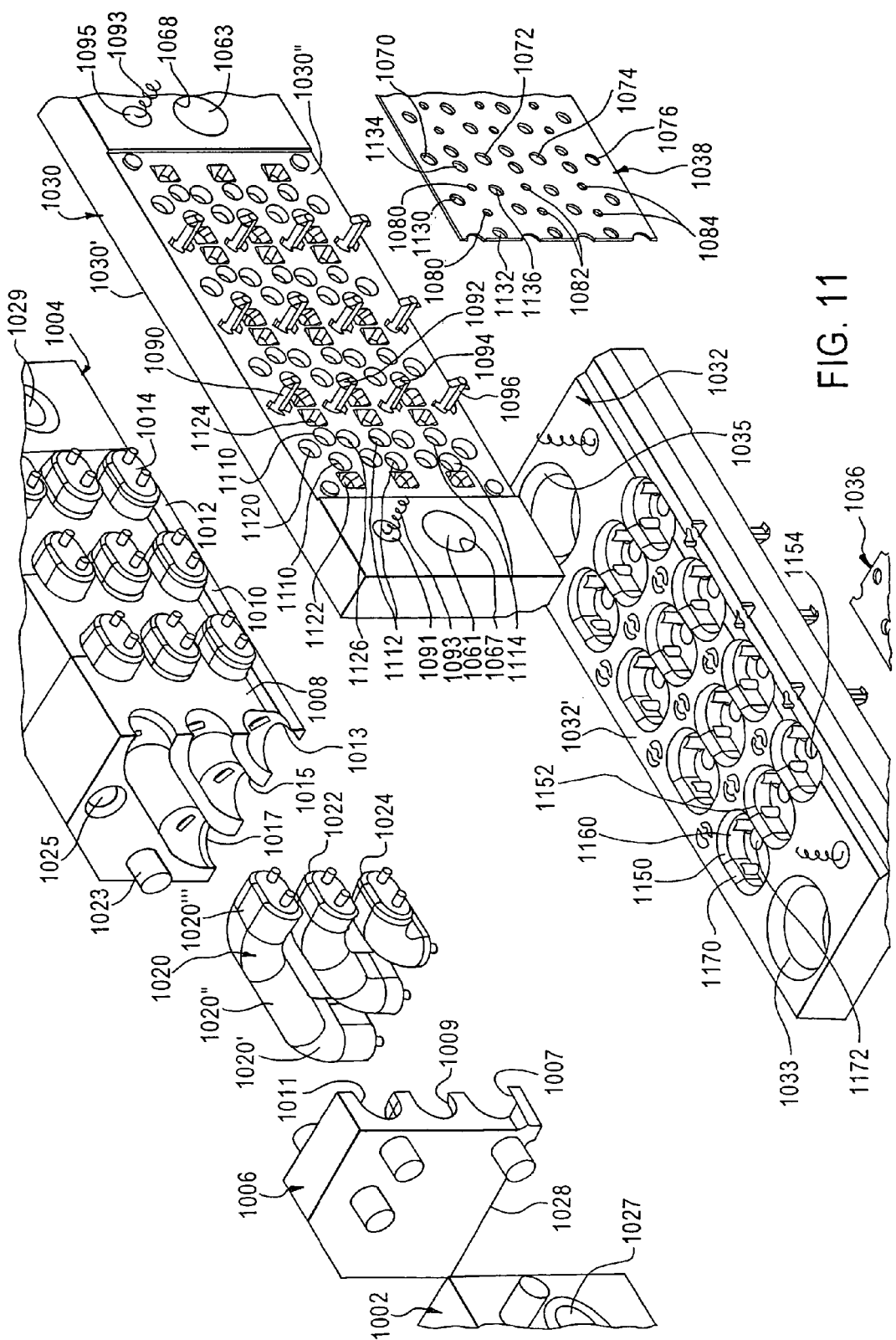
FIG. 11 is an enlarged exploded view of the cable housing interposers.

Refer now to FIG. 10 illustrating an electrical connector 1000. At the outset it should be noted that the electrical conductors 1020, 1022, and 1024 have the same electrical characteristics as-electrical conductors as 40 and 42 discussed above. As depicted in FIG. 10, an electrical conductor 1024 has the shortest path and an electrical conductor 1020 has the longest path. Referring to FIG. 11, for example, conductor 1020 has a downwardly extending straight portion 1020', an angled portion 1020" and a horizontally extending straight portion 1020'". The straight portions 1020' and 1020" facilitate installation of ends of the conductor 1020 into cable housing interposers 1030 and 1032, as explained below. For ease of explanation, only the housing for conductors 1020, 1022, and 1024 is explained here, although other sets of conductors are illustrated which have the same housings. FIGS. 11–13C illustrate additional details of the aforementioned arrangement.

Referring again to FIG. 10, the electrical connector 1000 includes opposed guide blocks 1002 and 1004 mounted on opposite ends of the electrical connector 1000, as discussed in detail below. The guide blocks 1002 and 1004 and the cable housings 1006–1014 can either be formed of individual molded parts as depicted and assembled together or can be formed as an over-molded assembly as described previously with respect to FIG. 1B. In between guide blocks 1002 and 1004 are a plurality of sets of electrical conductors. As used herein, conductors 1020, 1022, and 1024 form one vertical set of conductors. As illustrated in FIG. 10, there are four horizontal sets of three vertically stacked electrical conductors forming a vertical and horizontal array of twinax cable conductors, although it should be appreciated that any number of electrical conductors could be used. For example, instead of four sets of conductors, there could be eight sets of conductors. Alternatively, there could be, instead of a stack of three conductors, there could be stacks of two conductors or four or five conductors depending on the application.

Each of the electrical conductors 1020, 1022, and 1024 are retained by cable housings 1006 and 1008 and the other electrical conductors are retained by the respective cable housings 1008–1014. As depicted in FIG. 10, cable housing 1006 is specially adapted to mate with the guide block 1002 using horizontal pins 1006', 1006" and 1006'" which interlock with corresponding holes 1002', 1002" and 1002'" in the guide block 1002. Housings 1006 and 1008 each include recesses 1007, 1009, and 1011 and 1013, 1015, and 1017, respectively. Each cable housing includes a boss and a hole, for example, in cable housing 1008, there is a boss 1023 and a hole 1025 for interlocking with the cable housing 1006.

As depicted in FIG. 10, the electrical connector 1000 is a right angle (that is, 90 degree) electrical connector, although other configurations such as a straight connector can be arranged.

The electrical connector 1000 includes a central twinax or coax portion 1001 that includes all of the copper wire conductors 1020, 1022, and 1024 and all of the interlocked cable housings 1006–1012, and the guide blocks 1002 and 1004. As depicted in FIG. 10, there is a front rectangular surface 1026 and a bottom rectangular surface 1028 to the assembled central assembly 1001. Opposite ends of the conductors 1020, 1022, and 1024 extend slightly beyond the surfaces 1026 and 1028, respectively, exposing the outer jacket 128 of each of the twinax conductors 1020 and 1024. The central conductors 120 and 122 extend slightly beyond the dielectric 124 and the outer jacket 128 of the twinax conductors 1020 and 1024.

A rectangular interposer 1030 has a front surface 1030' and a back surface 1030". The interposer 1030 (that is, surface 1030') mates with the front surface 1026 of the assembly 1001. A second rectangular interposer 1032, having a front surface 1032' and a back surface 1032", mates (that is, surface 1032') with the bottom surface 1028 of the assembly 1001. The copper wire conductors 120 and 122 engage with the interposers 1030 and 1032 as explained below.

Spring contacts 1034 and 1036 are respectively retained by Mylar retainers 1038 and 1040. The Mylar retainers 1038 and 1040 could be made from any suitable material including heat shrinkable plastic. The spring contacts 1034 and 1036 are strategically placed and extend within interposer cable housing 1030 and 1032 and interposer slides 1042 and 1044, respectively. The front surface 1030' of the interposer 1030 is rigidly mounted to the front surface 1026 by either press fit studs, ultrasonic welding or epoxy. A pair of opposed pins 1009 and 1009' extend from the surface 1026 and the guide blocks 1002 and 1004, respectively, into recessed holes that (not shown) extend inwardly from the surface 1030'. The pins 1009 and 1009' keep the interposer 1030 aligned with the cable housings 1006–1014. Pins (not shown) extend from the surface 1026 of the guide blocks 1002, 1004 to keep the interposer 1032 aligned with the cable housings 1006–1014. The spring contacts 1034 and 1036 include ground contact spring contacts and signal carrying spring contacts as explained below. A pair of guide pins 1046 and 1048, are provided on the backpanel for mounting the electrical connector 1000 thereto. Guide pins 1046 and 1048 extend through holes 1050 and 1035 and 1048 and 1033, respectively, and mate with the latching mechanisms. As depicted in FIG. 10, a cylindrical guide socket body 1003 extends from the guide block 1002 for receiving the guide pin 1048. Guide block 1004 has a similar guide socket body (not shown) for receiving guide pin 1046. The guide blocks 1002 and 1004 each have a threaded insert 1027 and 1029, respectively, positioned at right angles from the guide socket body 1003 and aligned with corresponding holes 1061 and 1063 in interposer 1030 and holes 1080 and 1082 in the interposer slide 1042. Threaded fasteners extend from the daughtercard to fasten the electrical connector 1000 to be threaded into the threaded inserts 1027 and 1029.

Turning now to FIG. 11, it can be more clearly seen that the Mylar sheet 1038 includes a plurality of stamped holes. The stamped holes are in a specific pattern for retaining and placing the spring contacts in holes in the interposers 1030 and 1032 and the interposer slides 1042 and 1044. The holes used to retain the signal carrying spring contacts must be held to tight tolerances to hold the spring contacts securely yet not so tight to overly compress the spring contacts and significantly change the outer diameter thereof.

Figure 12:
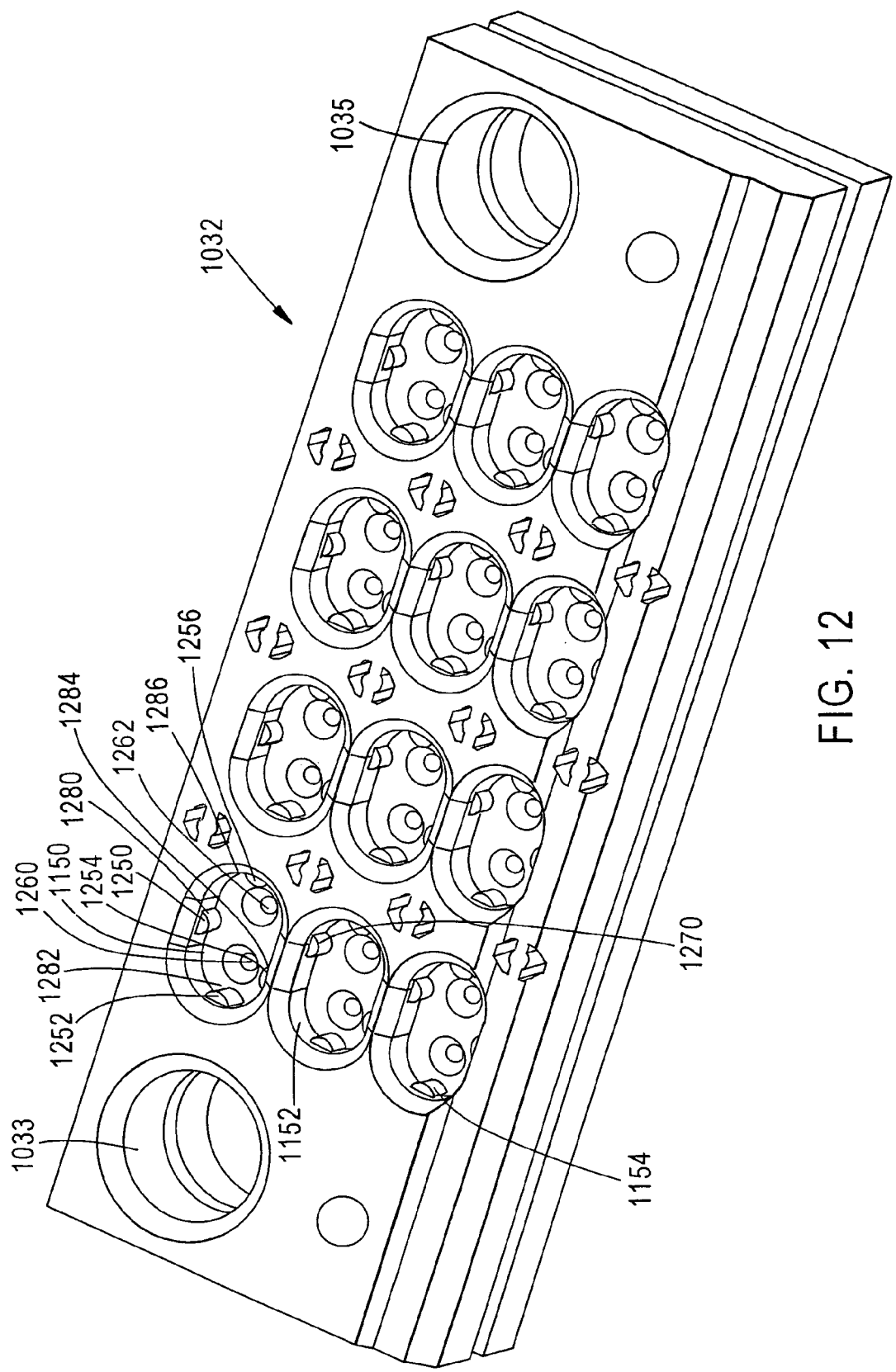
FIG. 12 is an enlarged view of a front side of the interposer cable housing shown in FIG. 10.
Figure 13:
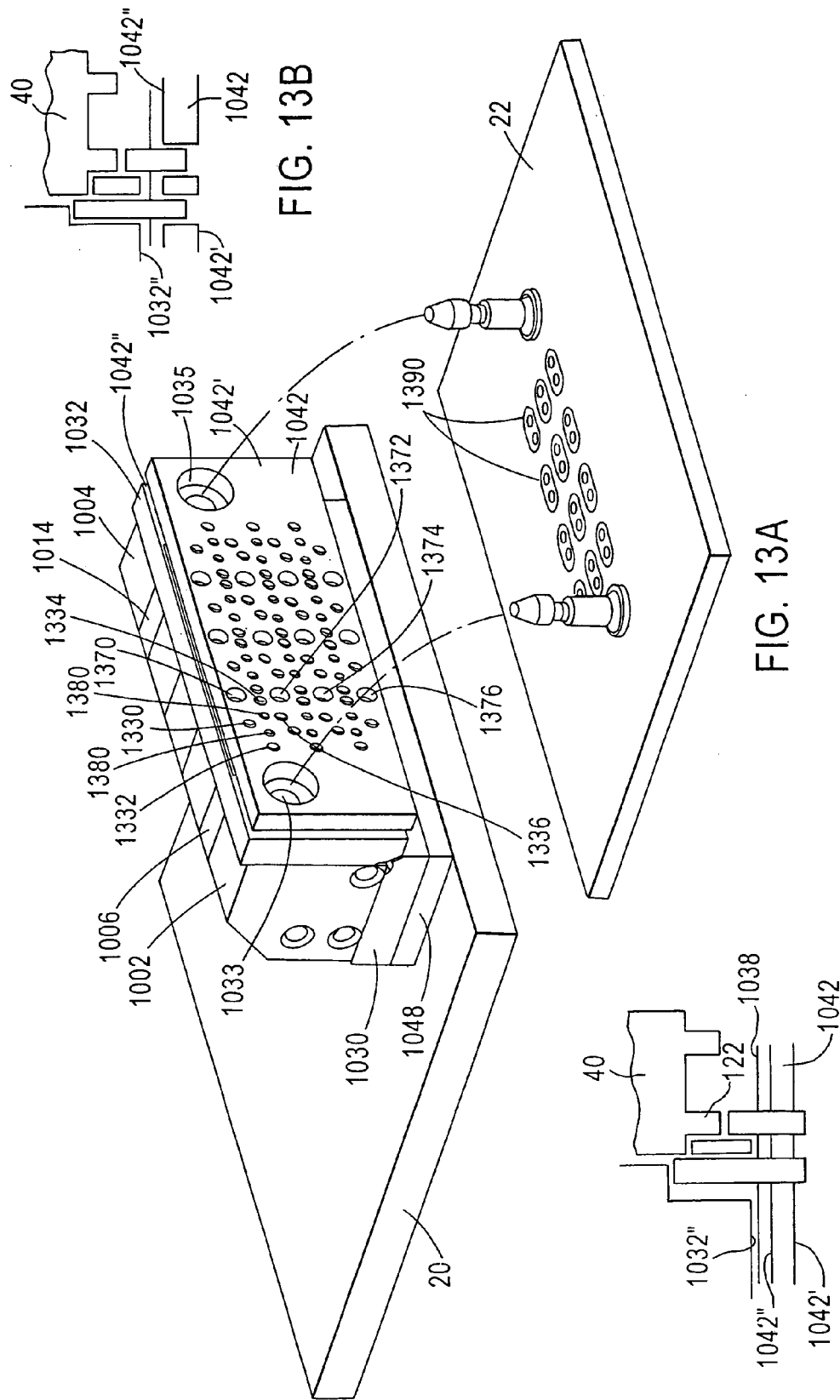
FIG. 13A is a perspective view of the electrical connector of the parent application mounted to a daughtercard with the daughtercard interposer slide being in a retracted position and the backpanel interposer slide being in an extended position.
FIG. 13B is a cross-sectional view of spring contacts being retained by the Mylar sheet illustrating one end of the spring contacts within the interposer slide when the interposer slide is in an extended position.
FIG. 13C is a cross-sectional view similar to FIG. 13B illustrating the one end of the spring contacts extending beyond the interposer slide when the interposer slide is in a retracted position.

Stamped holes 1070, 1072, 1074 and 1076 are in vertical alignment for receiving retaining tines 1090, 1092, 1094, and 1096 in the interposer 1030. The holes 1404 and 1406 and the retaining tines 1090–1096 maintain the interposer slide 1042 in alignment with the interposer 1030. The retaining tines 1090–1096 are of sufficient length to permit the interposer slide 1042 to be biased into the extended position by springs 1091 and 1093 mounted in holes 1095 and 1097 in the surface 1030" of the interposer 1030. The retaining tines 1090–1096 will be flush or below surface 1092 in the retracted position. The spring contacts 1034 maintain the alignment of the Mylar sheet 1038 relative to the interposer 1030 and the interposer slide 1042. The interposer 1030 includes a top set of holes 1110 for receiving the leads of conductor 1020, middle holes 1112 for receiving the center leads of conductor 1022 and a bottom set of holes 1114 for receiving the leads of the conductor 1024. Each interposer has multiple ground holes, for example, four ground holes, into which the spring contacts are placed to make contact with the outer conductive layer 128 of each of the conductors 1020, 1022, and 1024. For example, as depicted in FIG. 11 with respect to conductor 1020, the interposer 1030 has holes 1120, 1122, 1124, and 1126. The Mylar sheet has corresponding holes 1130, 1132, 1134, and 1136. Each interposer 1030 and 1032 includes a plurality of recesses shaped to match the exterior of each of the conductors 1020, 1022, and 1024. As depicted in FIGS. 11 and 12, the electrical conductors have a straight center section and rounded outer sections. The spring contacts placed in holes 1130, 1132, 1134, and 1136 will be in contact with the outer jacket 128 of the conductor and will provide a ground path and electrical shield between adjacent twinax cables. The recess 1150 extends inwardly from front surface 1032' of the interposer 1032. For example, the recess 1150 may comprise opposed curved walls 1160 and 1162 connected by straight sections 1170 and 1172. The straight sections 1170 and 1172, are depicted as extending horizontally. The recess 1150 is shaped to receive the outer jacket 128 of the twinax cable.

Turning now to FIG. 12, the interposer 1032 is depicted in large data. It should be understood that interposers 1030 and 1032 are identical except for the opposed holes used for the guide pins 1046 and 1048 that extend respectively through interposer 1032 into guide blocks 1002 and 1004. The holes 1048 and 1050 are offset relative to a longitudinal centerline of the interposer slide 1044 as are holes 1033 and 1035 that are aligned therewith. By contrast, the holes 1066 and 1068 in the interposer 1030 are on the centerline as are the holes in the interposer slide 1048.

Each central conductor 120 and 122 has multiple spring contacts associated with it. For example, as depicted in FIG. 12, there are two holes 1260 and 1262 aligned with the central conductors 120 and 122. There are also two central spring contacts (not shown) which make contact with the central leads of the conductors 120 and 122 and which have one end in the holes 1260 and 1262. A front surface of the insulator 124 can bottom out in the recess 1150. With respect to the recess 1150, there are four spring contacts 1250, 1252, 1254, and 1256 installed in holes 1280–1284. Holes 1280–1284 are blind holes and intersect with the periphery of the recess 1150. One ground contact, preferably a spring contact (not shown), is installed in each of the holes 1250–1256 and these spring contacts used as ground contacts with the electrically conductive outer jacket 128 of the central conductor. Four ground contacts provide excellent shielding. Additional holes and spring contacts can be added to enhance cross-talk reduction.

It should be noted that hole 1250 is centrally located between signal carrying spring contacts 1260 and 1262. Hole 1254 is offset relative to the center of recess 1150 closer to hole 1260, whereas in the adjoining recess 1152, hole 1270 is offset in the opposite direction. It should be noted that excellent electrical shielding is achieved without having to provide a 360 degree coverage of each of the twinax cables. Thus, adjacent vertically aligned recesses have offset holes for spring contacts. By offsetting the holes, a greater percentage of the circumference is shielded.

Referring now to FIGS. 13A, B and C and referring to the interposer slide 1042, it should be seen that there are four vertically aligned holes 1370, 1372, 1374, and 1376 for respectively receiving tines 1090, 1092, 1094, and 1096. Preferably, the interposer will be spring loaded in a direction away from interposer 1030. This protects the spring contacts from becoming damaged or dislodged during shipping and assembly. It should be understood that the explanation is provided only for the left most set of holes and that the hole pattern repeats. The uppermost conductor 1020 has a set of corresponding holes in the interposer 1042. Hole 1330 for receiving a ground spring contact aligns with hole 1130 in the Mylar sheet and hole 1120 in interposer 1030. Hole 1332 aligns with hole 1132 in the Mylar sheet and hole 1122 in the interposer. Hole 1334 aligns with hole 1134 in the Mylar sheet and hole 1124 in the interposer 1030. Hole 1336 aligns with hole 1136 in the Mylar sheet and hole 1126 in interposer 1030. Similarly, holes 1380 align with holes 1080 in the Mylar sheet 1038 and holes 1110 in the interposer 1030. As depicted in FIG. 13A, the interposer 1032 is illustrated in an extended position in which the fuzz buttons are below the surface 1042" or at maximum 0.020 above the surface 1042" and are thereby protected during shipment of the electrical conductor 1000. As depicted in FIG. 13A, there is a gap between the surface 1032" of the interposer 1032 and the surface 1042 of the interposer slide. The spring contacts are held between the interposer 1030 and the interposer slide 1048 are in contact with the daughtercard 20. By contrast, the interposer 1032 and the interposer slide 1044 are in contact with the backpanel 22.

The backpanel printed circuit board with guide has a plurality of conductive pads 1390. The pads have two signal carrying conductors 1392 and 1394 to be brought into contact with the signal carrying spring contacts and an outer ground section 1396 (see FIG. 14). The pads 1390 advantageously do not have to be through plated holes. The pads 1390 can be surface mount or can have blind vias. By avoiding through plated holes, capacitive effects associated with the holes are reduced and speed can be increased.

It is important to provide shielding for the length of the exposed central conductor and for the length of the signal carrying spring contacts to prevent cross-talk between adjacent twinax cables. The aforementioned connector advantageously achieves this shielding using four spring contacts connected to ground. These spring contacts provide less than 360 degree shielding but testing has revealed that the level of shielding achieved is sufficient to provide data rates up to 10 Gb/sec and greater.

Further, the Mylar sheet 1038 retains the signal carrying spring contacts by compressing the spring contact around the circumference without reducing the outer diameter significantly. Thus, the diameter of the spring contact is not changed significantly when compressed into the PC board. Also advantageously, the force exerted by the spring contacts in a direction away from the PC board is relatively small, thus allowing the use of a simple latching mechanism. By changing the shape, number and rigidity of the conducting elements, the contact resistance, contact force and compressibility can be selected within a wide range to meet the needs of the particular application. The overall cumulative contact force of spring contacts 1039 and 1036 against contact surfaces 1390 is low due to the resilient construction and compressibility of the springs.

While the interconnection systems of the parent application described above have numerous advantages as compared with Prior Art interconnection systems, many drawbacks were found in practical applications of such interconnection systems. Namely, a substantial number of precision components were needed to fabricate such interconnection systems, thereby increasing production costs and reducing production yields. Furthermore, assembling such interconnection systems with unprotected spring contacts proved to be extremely difficult in view of the fragility of the spring contacts, thereby also increasing production costs and reducing production yields.

In view of the above, a detailed study of the interconnection systems described above was undertaken in order to determine how their drawbacks could be eliminated. The Applicants determined that by using "top hats" in conjunction with the spring contacts, the resultant improved interconnection system could be substantially simplified and the number of components needed substantially reduced as compared to the interconnection systems described above, thereby decreasing production costs and increasing production yields. Furthermore, assembling such improved interconnection systems using top hats in conjunction with the spring contacts simplified assembling such improved interconnection systems, thereby also decreasing production causes and increasing production yields.

A top hat is a solid metal cylinder that makes contact with the spring contacts and pad on PCB. One end of the cylinder has a shoulder that extends in a plane that is substantially perpendicular to an axis of the cylinder. Such top hats are manufactured in sizes allowing for insertion of spring contacts. For example, top hats are manufactured by Technical Wire Products, Inc. of Piscataway, N.J. for use with their Fuzz Buttons™. The closed end of the top hat cylinder may be flat, hemispherical, conical, or include serrations or points to facilitate making good electrical contact with its mating contact.

The following is a description of an example of an embodiment in accordance with the present invention. It is to be noted that the embodiment discussed below is merely for illustrative purposes and it is to be noted that the present invention is not limited to the disclosed embodiment.

Figure 14:
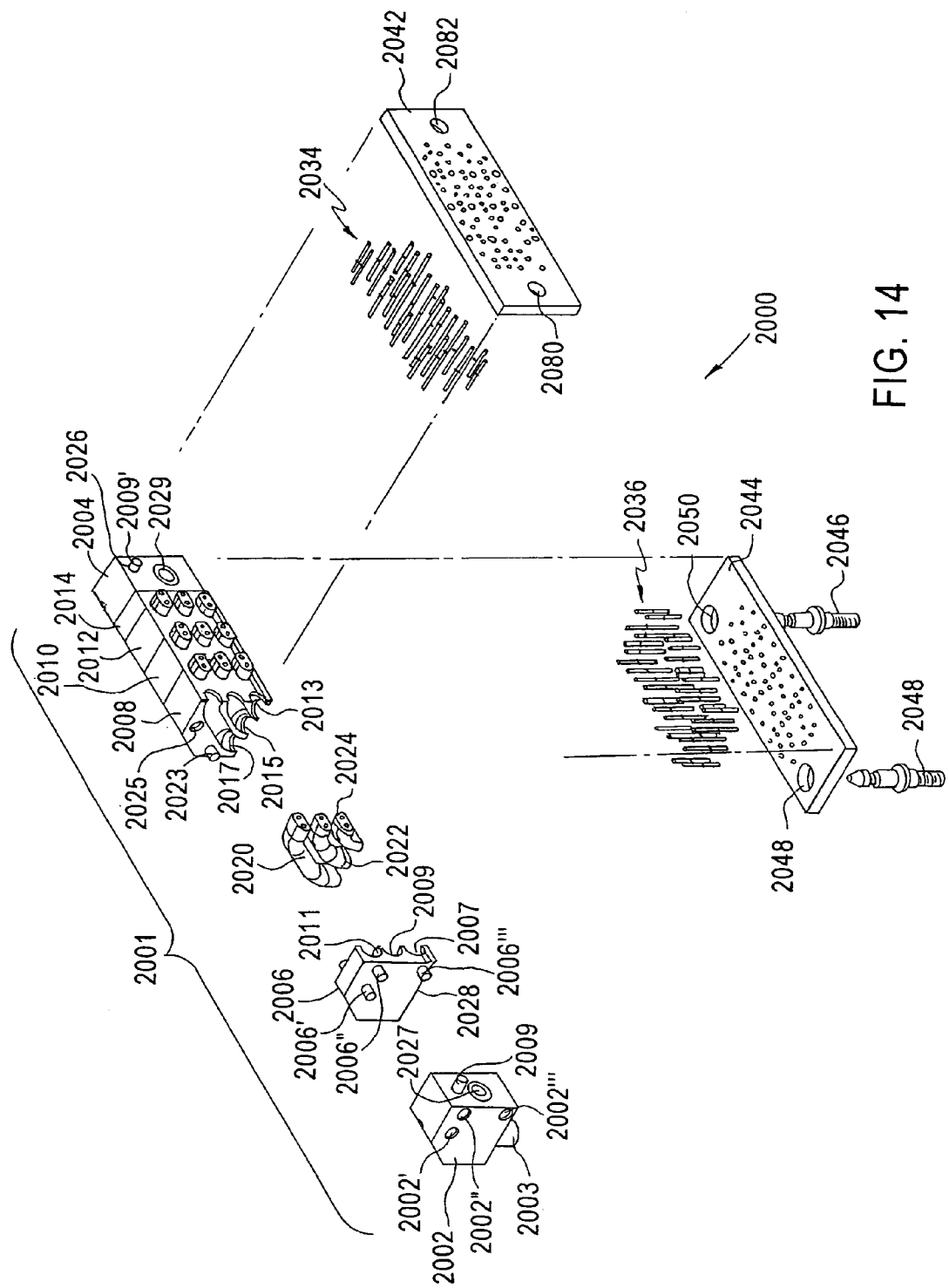
FIG. 14 is an exploded view of an example embodiment of an electrical connector according to the principles of the present invention.

FIG. 14 is an exploded view of an example embodiment of an electrical connector according to the principles of the present invention. In comparing the connector 2000 of FIG. 14 with the connector 1000 of FIG. 10, one immediately notices that there are significantly fewer elements to the connector 2000 of FIG. 14. This reduction of elements reduces manufacturing costs while simplifying the assembly of the connector.

Referring to FIG. 14, elements 2001 essentially correspond to elements 1001 of FIG. 10 but with one exception. Namely, the twinax cable sections 2020, 2022, and 2024 have their center conductors in the same plane as that of their respective outer conductors. That is, is has been found that it is unnecessary to extend the center conductors beyond the plane of their respective outer conductors. This simplifies the fabrication of the twinax cable sections 2020, 2022, and 2024 and reduces their cost while making them stronger in that the exposed center conductors of the twinax cable sections 1020, 1022, and 1024 of FIG. 10 were vulnerable to being bent or damaged.

Referring back to FIG. 14, elements 2036 and 2034 are not merely the spring contacts 1036 and 1034 of FIG. 10 but rather comprise spring contacts and their corresponding top hats, the details of which will be discussed below. Interposers 2042 and 2044 include guide apertures 2048, 2050, 2080, and 2082 that are used to position their respective interposers using guide pins 2048 and 2046 in the case of interposer 2044. The guide pins for interposer 2042 are not shown. As will be discussed later, elements 2036 and 2034 may also comprise one-piece semi-rigid spring contacts.

Figure 15:
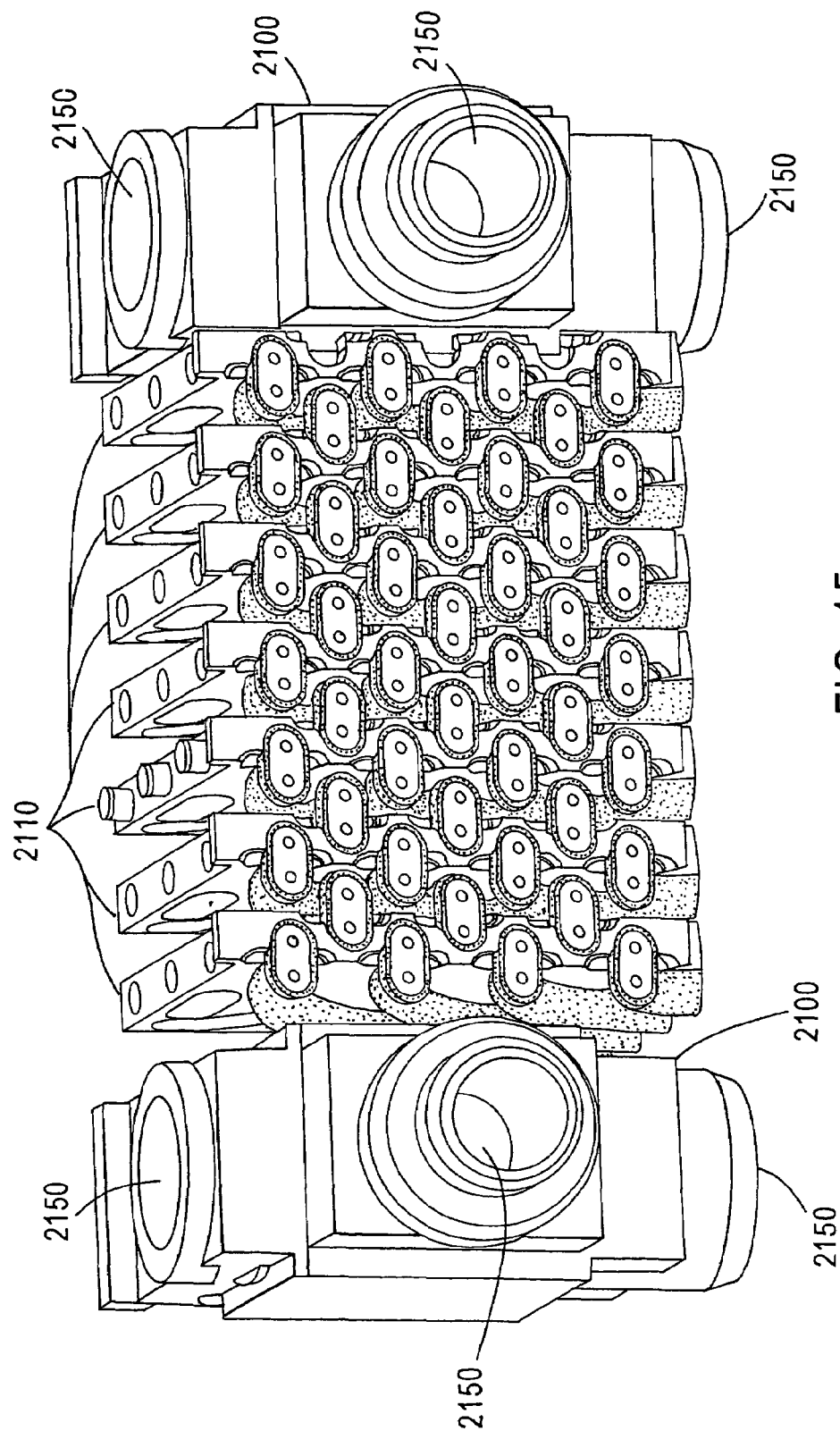
FIG. 15 is a view of a partially assembled connector according to the principles of the present invention.

FIG. 15 is a view of a partially assembled connector. End pieces 2100 are located on the ends of spacers 2110. In the connector illustrated in FIG. 15, the spacers 2110 include a greater number of twinax cable sections than those of FIG. 14. Since the spacers 2110 are identical, this allows the fabrication of connectors of varying size utilizing the same components. This also reduces manufacturing and production costs while simplifying the assembly of connectors of varying size. Furthermore, while a particular number of twinax cable sections are shown for each spacer, the present invention is not limited thereto. Connectors of varying size can easily be fabricated utilizing a small number of different identical elements. Multiple guide pin apertures 2150 are shown for each end piece 2100. As will be discussed below, only two of the three apertures 2150 are used in the fabrication of the connector.

Figure 16:
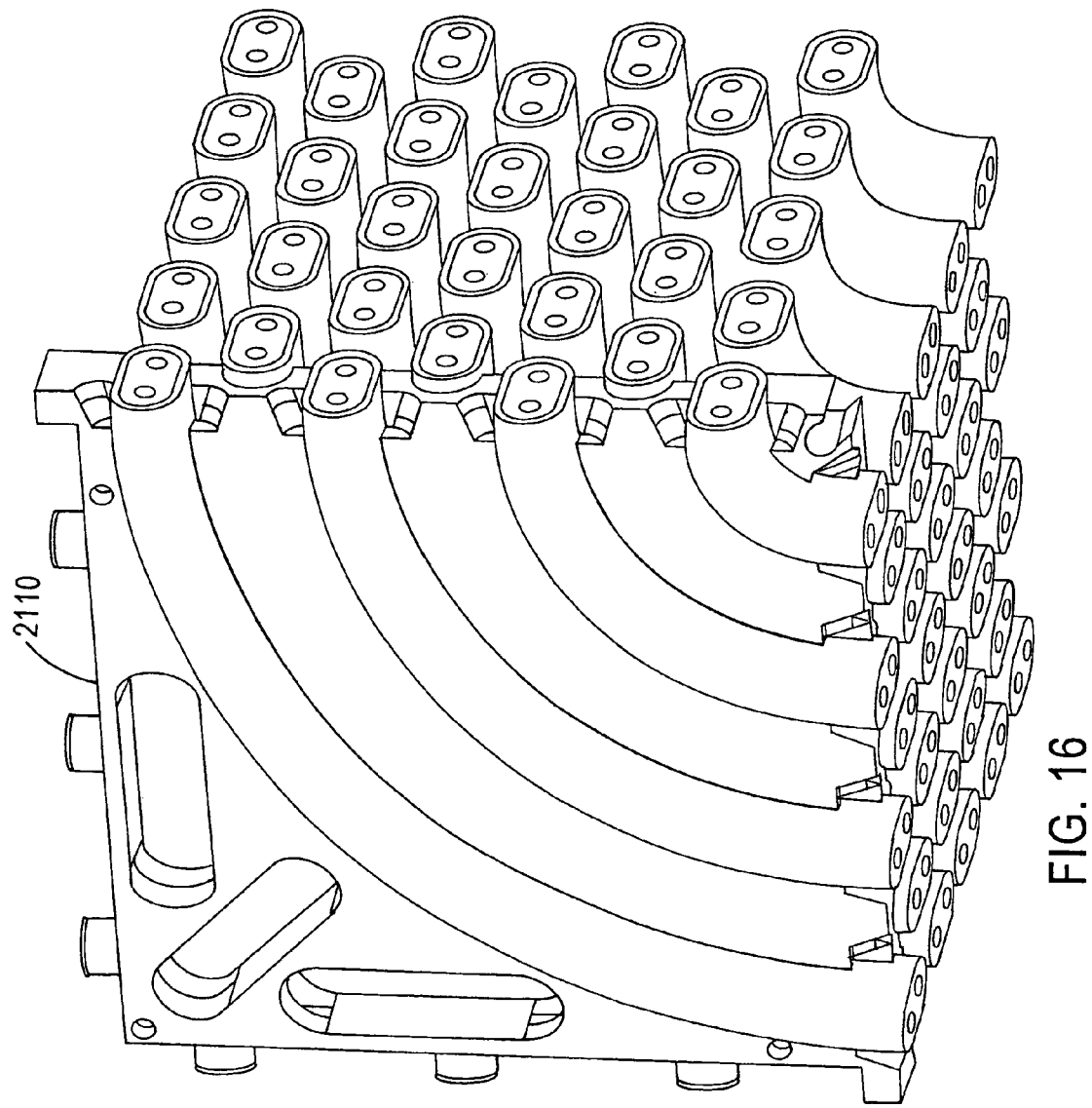
FIG. 16 is a view of portions of the connector according to the principles of the present invention.

FIG. 16 is another view of the spacers 2110 and their relationship with the corresponding twinax cable sections. While not clearly illustrated in this drawing, the spacers 2110 may include small pins and mating apertures so as to allow them to be aligned and to snap together. Other alignment and fastening techniques may also be used.

Figure 17:
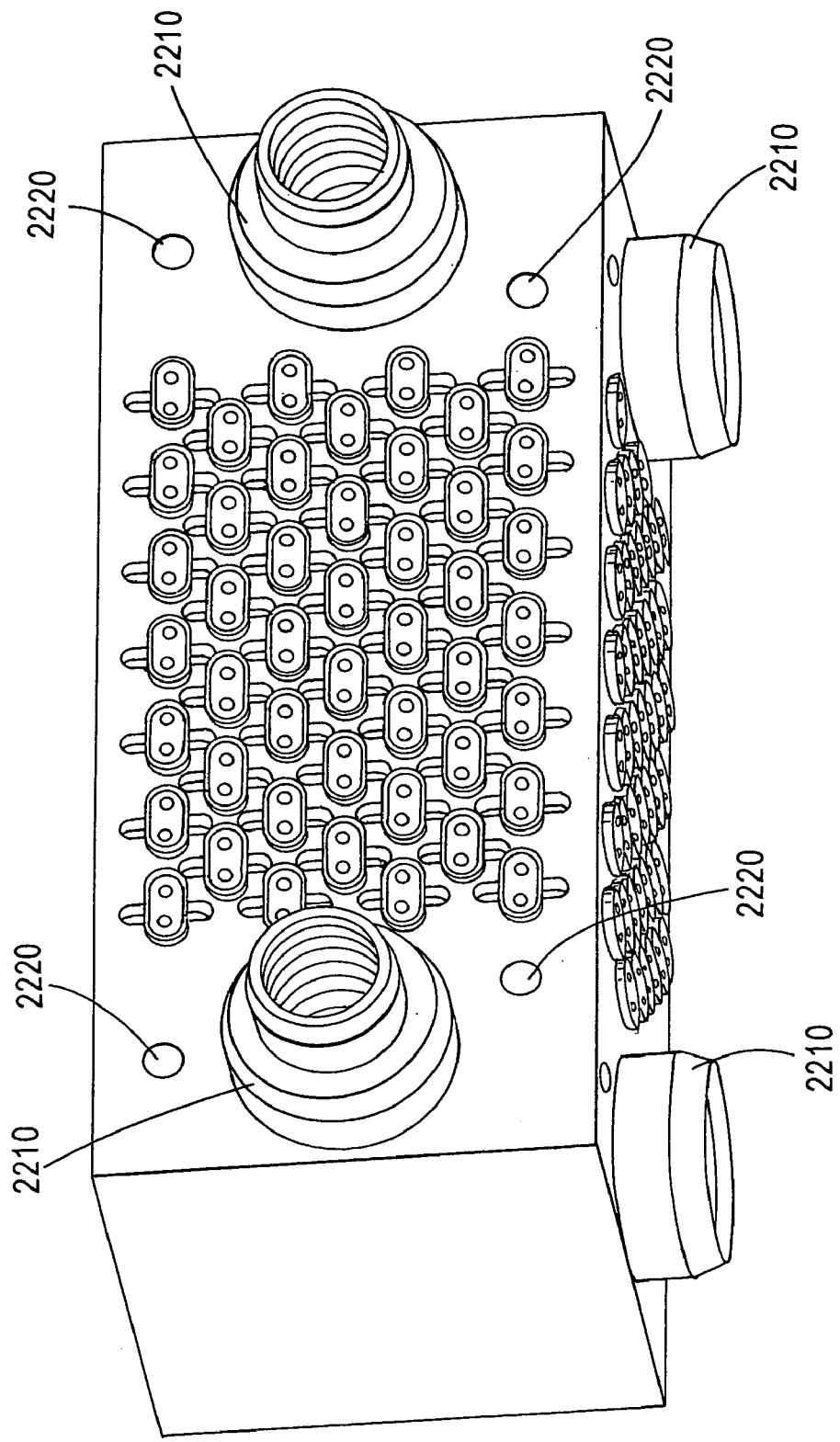
FIG. 17 is a view of the connector according to the principles of the present invention prior to the attachment of the interposers.

As illustrated in FIG. 17, after the elements illustrated in FIGS. 15 and 16 are assembled, they may be permanently joined by over-molding or encapsulation to produce a unified subassembly capable of withstanding mechanical and thermal shock as well as being essentially impervious to moisture.

Figure 18:
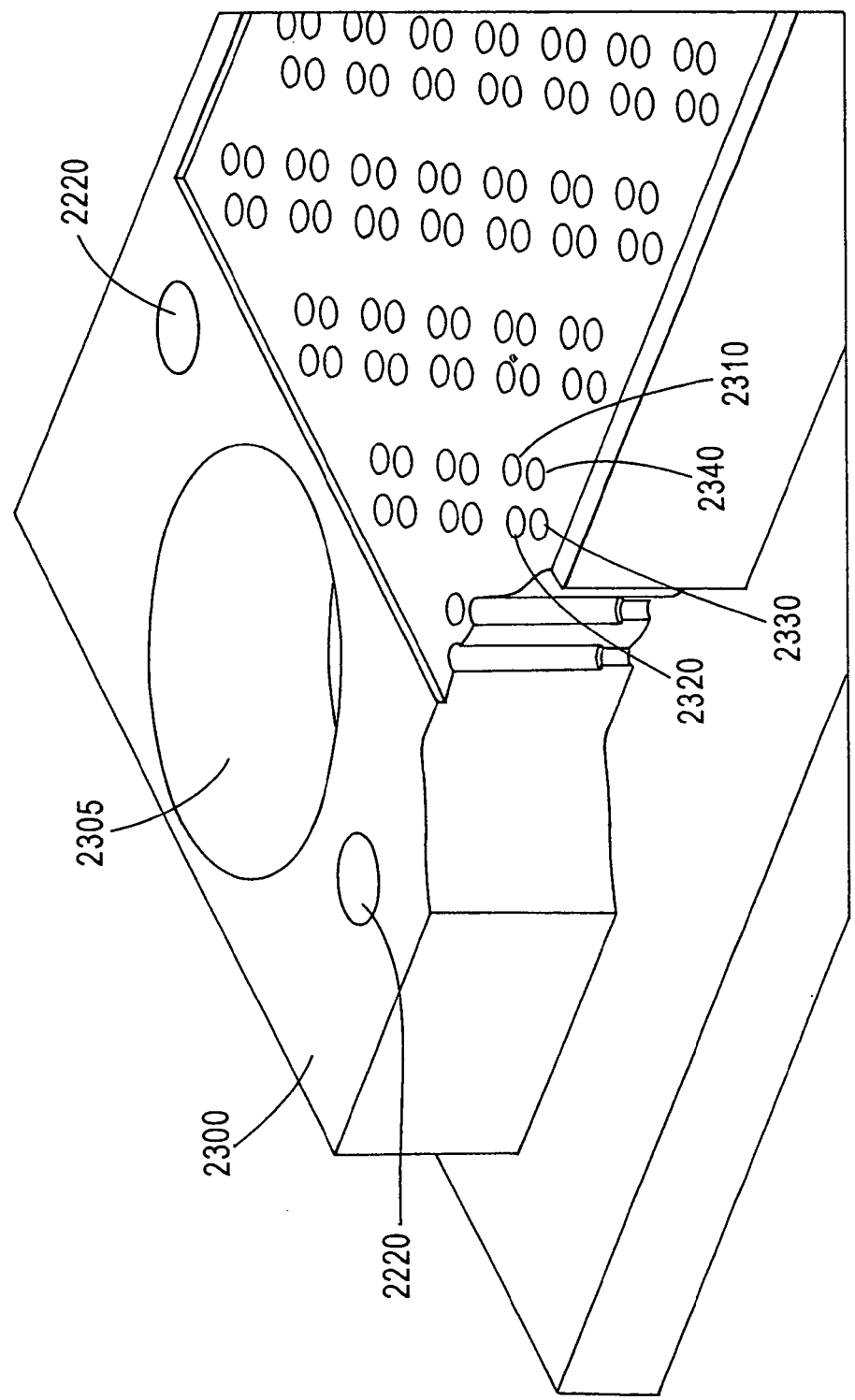
FIG. 18 is a view of one interposer of the connector of FIG. 14.

FIG. 18 is a view of a portion of one interposer 2300 of the connector of FIG. 14. The interposer 2300 includes a pair of apertures 2305 that mate with corresponding guides 2210 illustrated in FIG. 17. The interposer 2300 includes four apertures located so as to correspond to apertures 2220 of the connector illustrated in FIG. 17. This allows a pair of the interposers 2300 to be affixed to the connector illustrated in FIG. 17 utilizing screws or pins, for example, which are inserted through the apertures of interposers 2300 into apertures 2220 of the connector illustrated in FIG. 17.

The pattern of the apertures 2310, 2320, 2330, and 2340 for each twinax cable section is illustrated in FIG. 18. Apertures 2320 and 2340 will respectively contain top hats that will contain spring contacts therein that will connect to the center conductors of a respective twinax cable section while apertures 2310 and 2330 will respectively contain top hats that will contain spring contacts therein that will connect to the shield conductor of a respective twinax cable section. The number of top hats that will contain spring contacts therein that will connect to the shield conductor of a respective twinax cable section is not limited to two as in this example embodiment.

Figure 19:
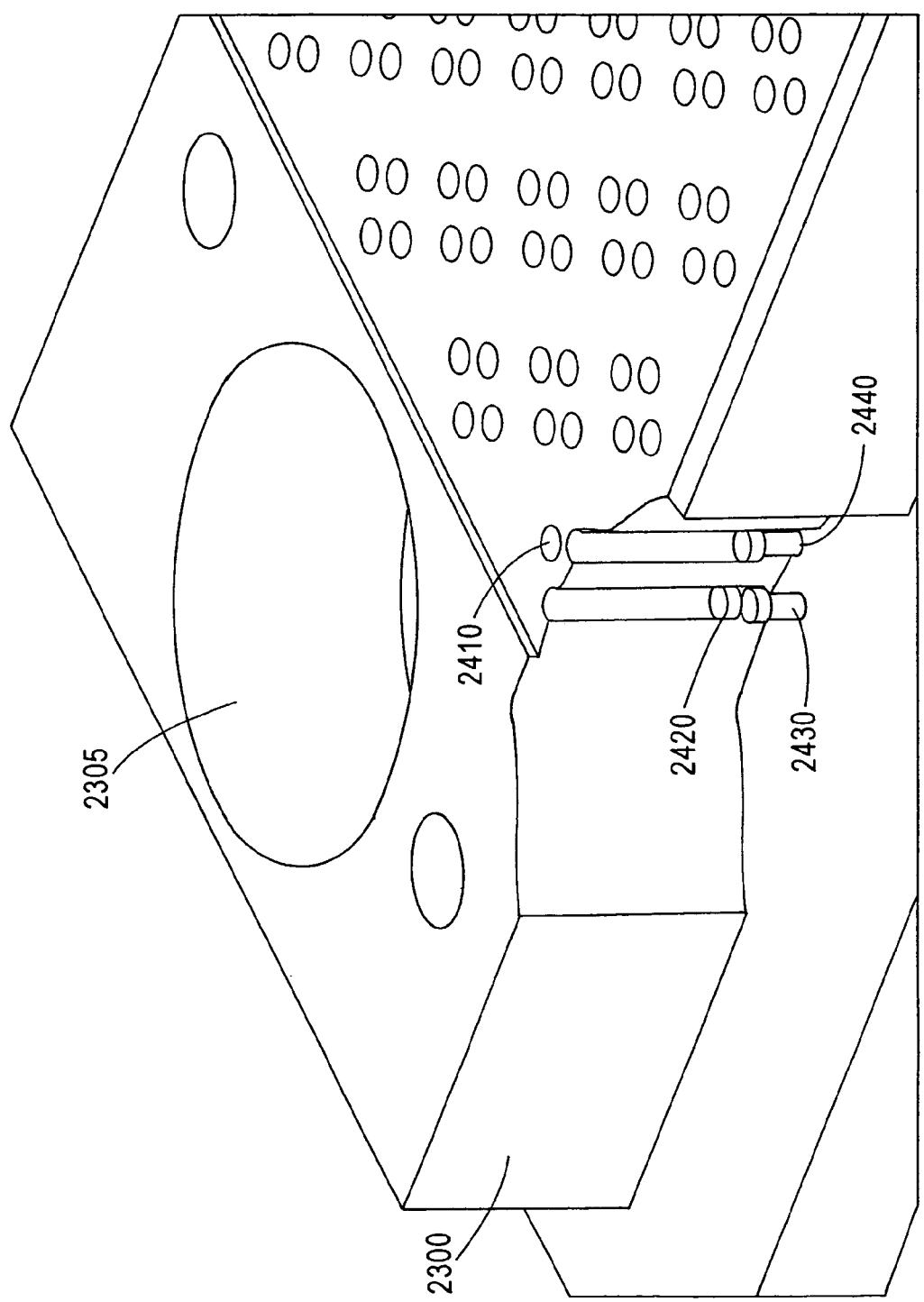
FIG. 19 is a view of the interposer of FIG. 18 with one set of top hats inserted therein.

Referring to FIG. 19, four top hats 2410, 2420, 2430, and 2440, three shown, have been inserted into respective apertures 2310, 2320, 2330, and 2340 in the interposer 2300. In a similar fashion top hats will be inserted into the remaining respective apertures in the interposer 2300. The apertures are made sufficiently large to allow vertical movement with respect to the interposer 2300 as will be discussed below.

Figure 20:
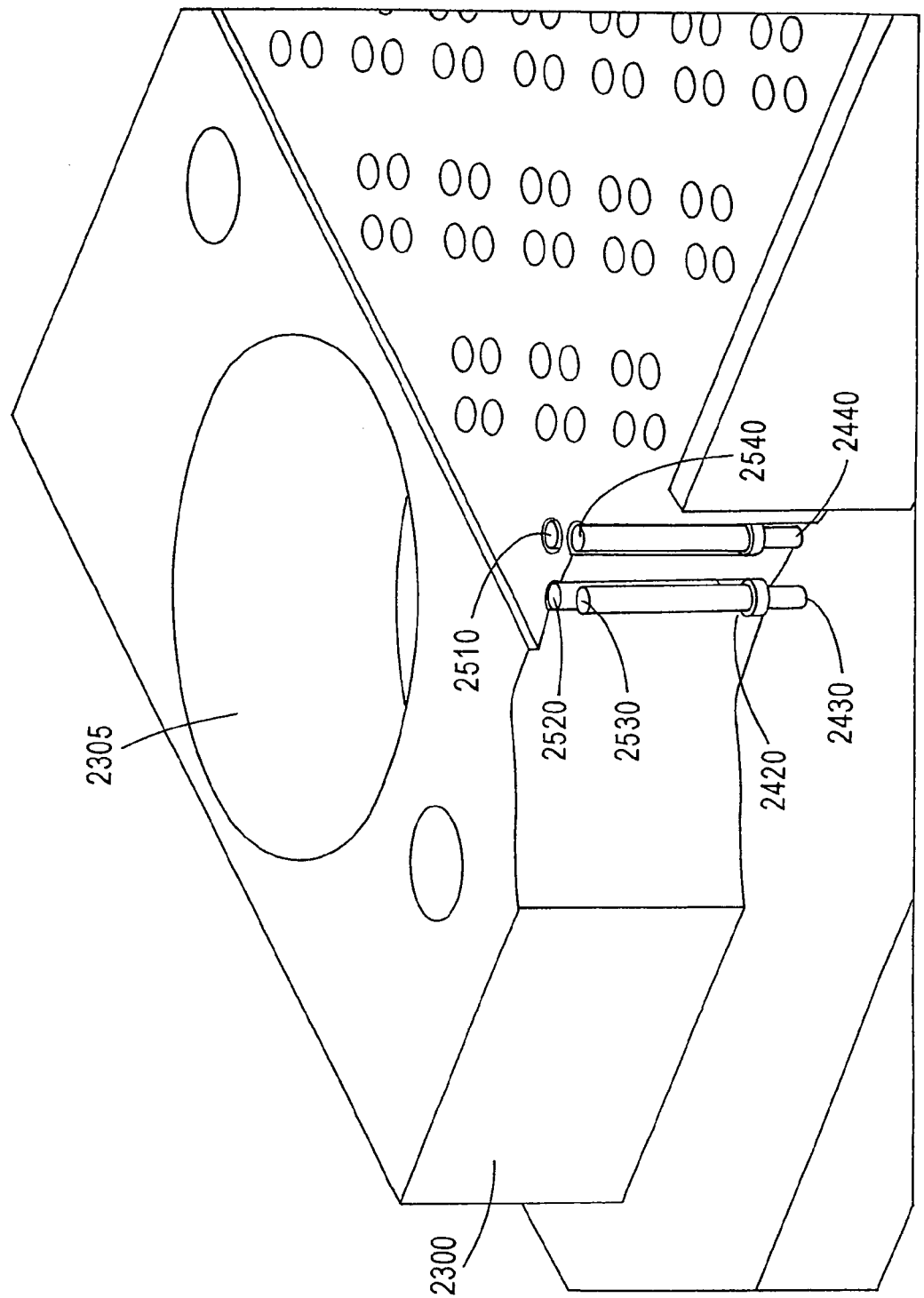
FIG. 20 is a view of the interposer of FIG. 19 with one set of spring contacts respectively against in the one set of top hats.

As illustrated FIG. 20, spring contacts 2510, 2520, 2530, and 2540 are respectively inserted against respective top hats 2410, 2420, 2430, and 2440. These spring contacts are sufficiently resilient to be retained by the top hats yet can still move with respect to the top hats. Since a substantial portion of the spring contacts 2510, 2520, 2530, and 2540 are disposed within their respective cores in interposer 2300, they are less likely to be damaged in comparison to the exposed spring contacts 1034 and 1036 of the connector of FIG. 10.

Figure 21:
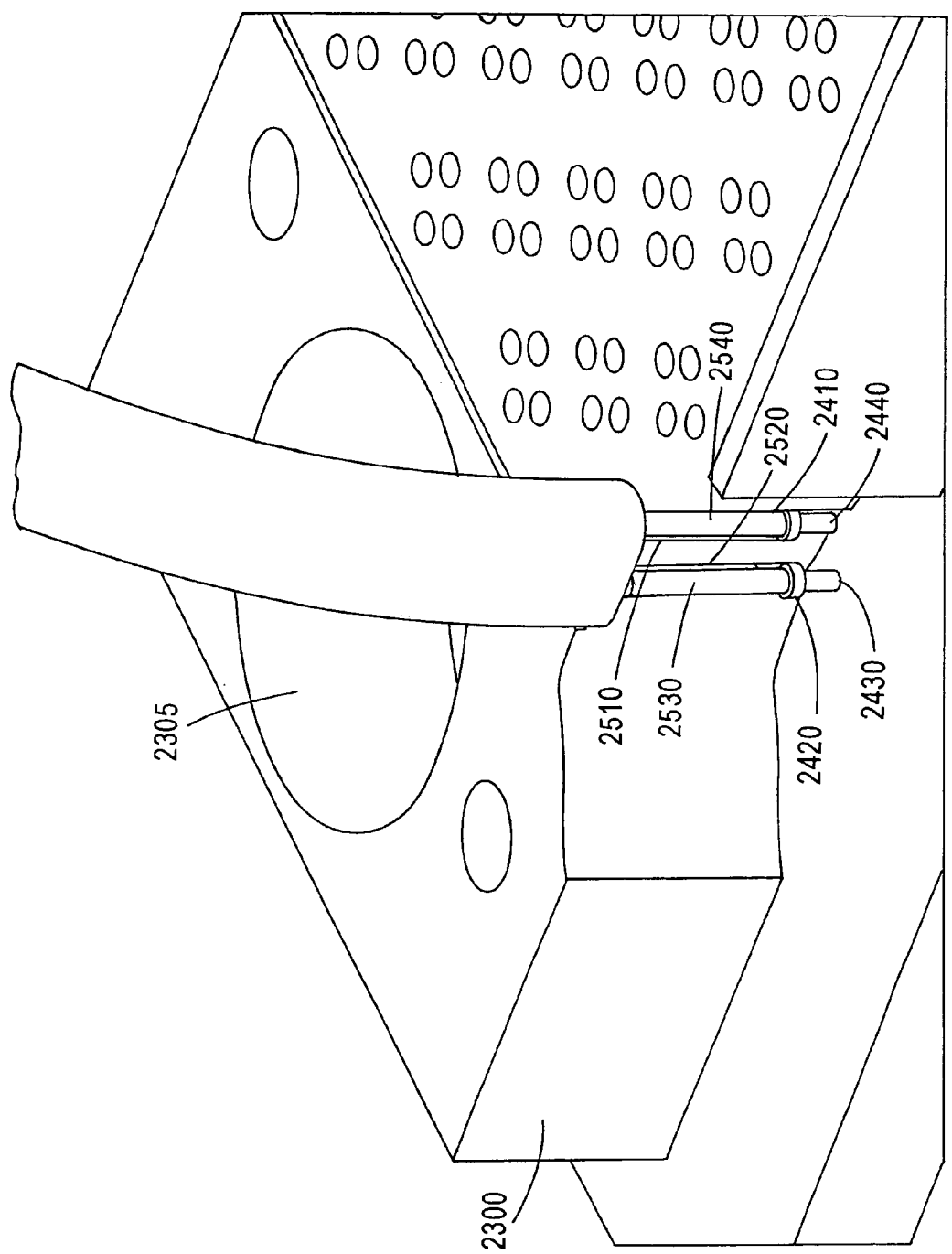
FIG. 21 is a view of the interposer of FIG. 20 with one end of a single twinax cable arranged with one set of spring contacts and top hats.

FIG. 21 illustrates a single twinax cable section 2600 arranged with its corresponding top hats 2410, 2420, 2430, and 2440 and spring contacts 2510, 2520, 2530, and 2540. As can be seen, spring contacts 2520 and 2540 connect to the inner conductors of the single twinax cable section 2600 while spring contacts 2530 and 2510 connect to the outer shield conductor of the single twinax cable section 2600.

Figure 21A:
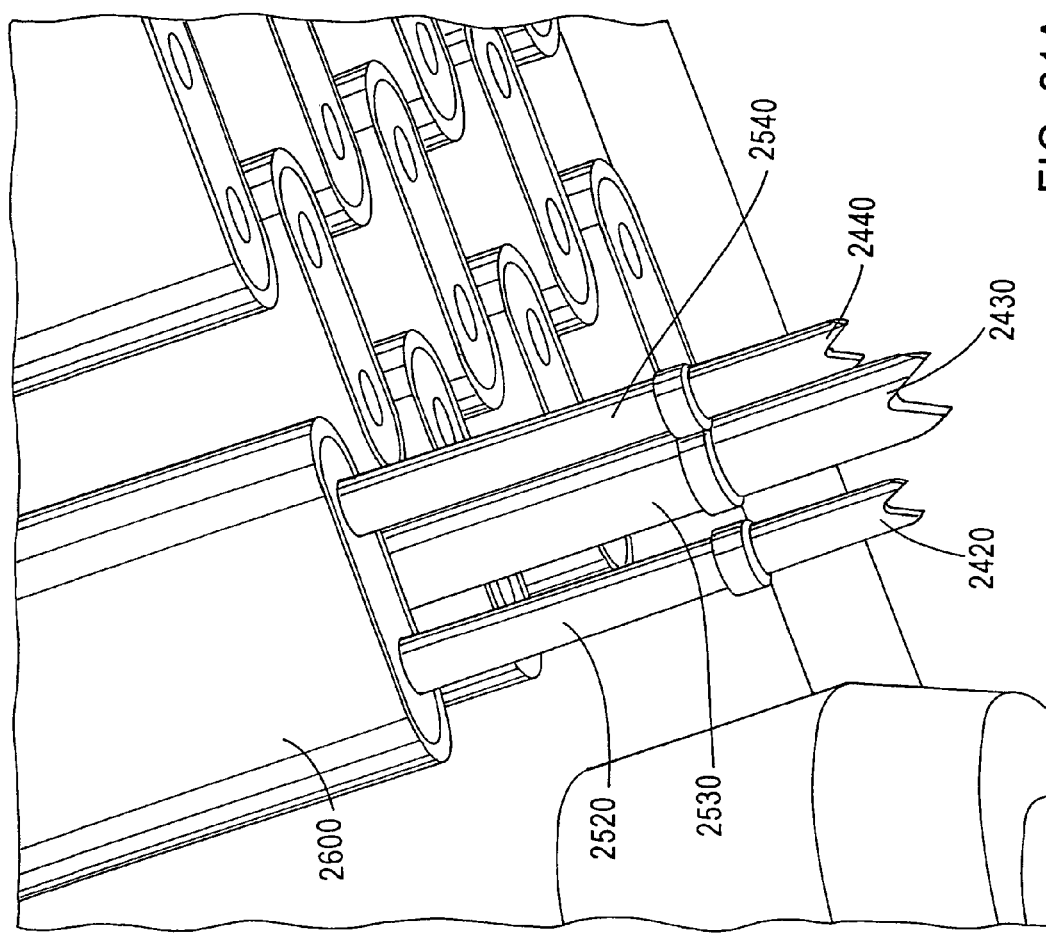
FIG. 21A is a close-up view of a portion of the arrangement of FIG. 21 with some elements being omitted for clarity.

FIG. 21A is a partial close-up view that illustrates the relationship between the single twinax cable section 2600 and its respective spring contacts 2520, 2530, and 2540 and its respective top hats 2420, 2430, and 2440. Note that FIG. 21A, top hats 2420, 2430, and 2440 are shown as having pointed ends. As noted above, it has been found that hemispherical or conical ends may provide sufficient electrical contact for the top hats, thereby reducing their manufacturing cost.

Figure 23:
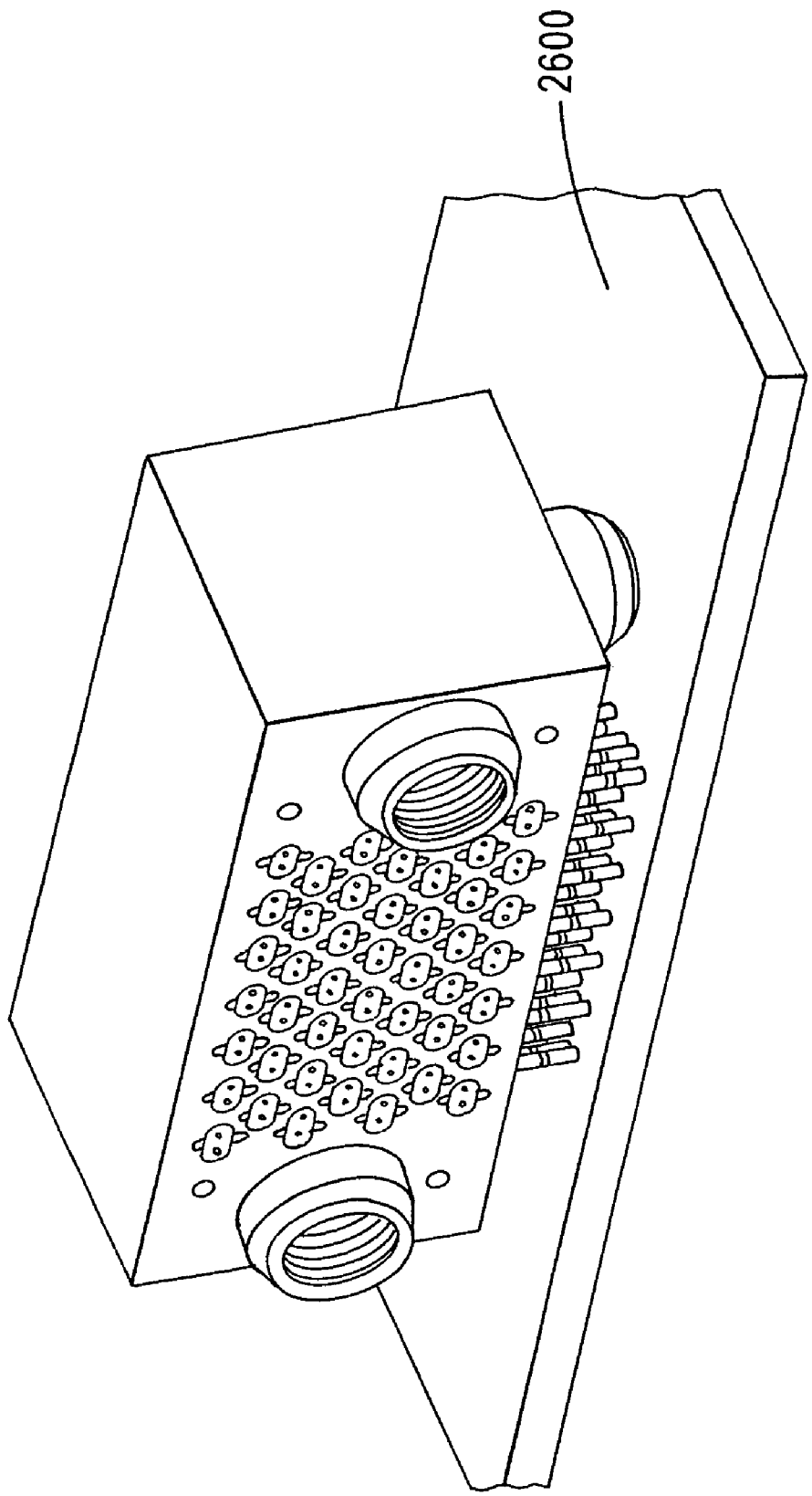
FIG. 23 is a view of the connector of FIG. 22 after encapsulation.
Figure 24:
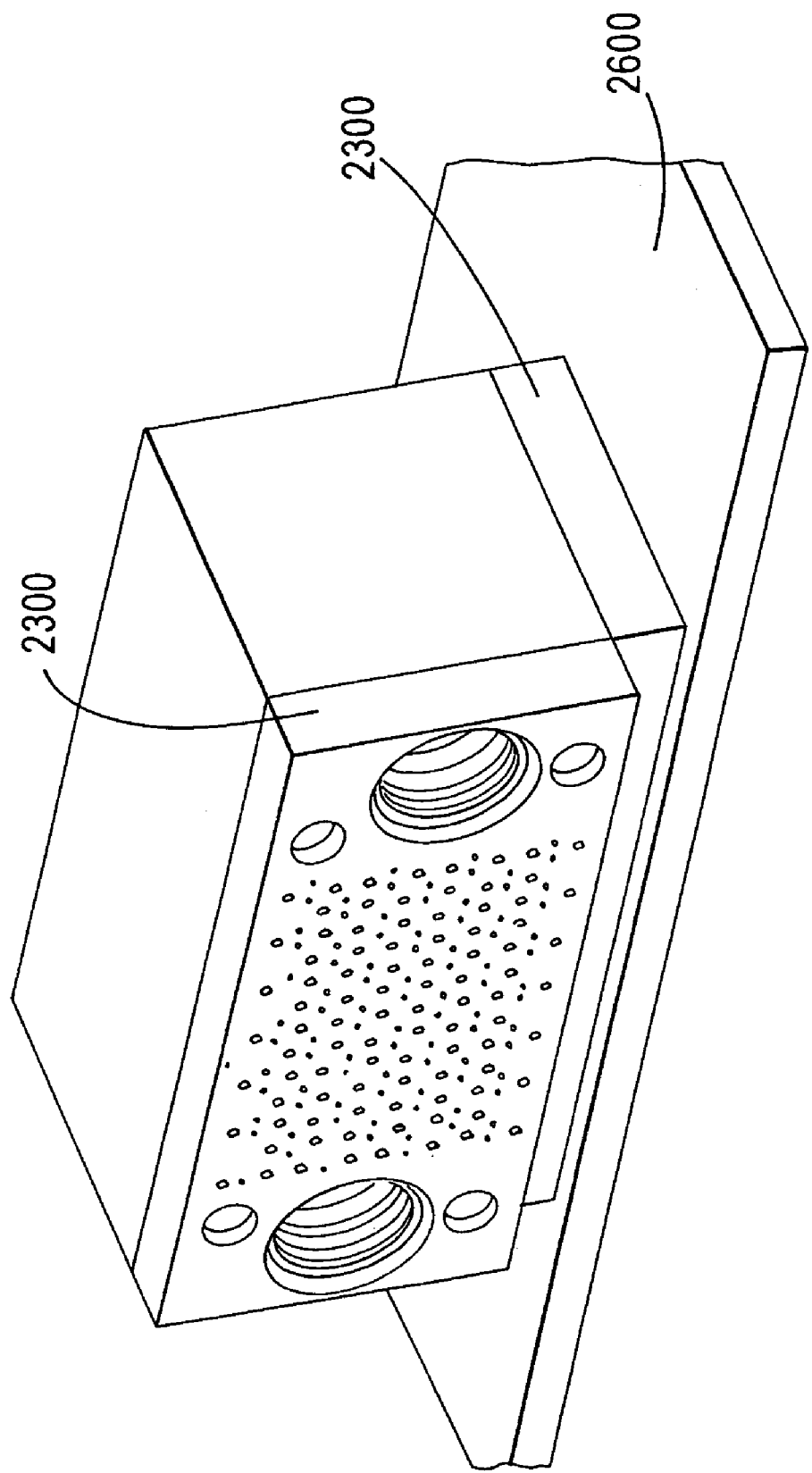
FIG. 24 is a view of the connector of FIG. 23 after attachment of the interposers.

FIG. 22 illustrates an interposer 2300 with all of its respective twinax cable sections and spring contacts and top hats in place, arranged next to a printed circuit board 2600. FIG. 23 illustrates the arrangement of FIG. 22 with the over-molding or encapsulation shown but no interposer while FIG. 24 illustrates the arrangement of FIG. 23 with the interposers 2300 in place and with the connector being affixed to a printed circuit board 2600.

The following is a description of the assembly of a connector in accordance with an example embodiment of the present invention, making reference to FIGS. 14–24.

Initially, spacers, such as spacers 2110 of FIG. 15, and twinax cable sections, such as sections 2020, 2022, and 2024 of FIG. 14, are snapped together until a connector portion of the appropriate size has been assembled. Since the spacers 2110 are identical, if they have been designed to accept twinax cable sections of seven different sizes, for example, it is only necessary to fabricate seven different sizes of twinax cable sections that may be used to assemble a connector of any appropriate size, thereby allowing the economies of scale produced by minimizing the number of different components needed to assemble connectors of varying sizes.

As illustrated in FIG. 15, end pieces 2100 are then affixed to each end of the spacer assembly and the resultant assembly joined together, normally by over-molding or encapsulation utilizing a suitable encapsulant. Other means, such as screws, pins, rivets, or adhesives may also be used to join the end pieces and the spacer assembly. After assembly, the resultant structure would appear as illustrated in FIG. 17.

The next assembly step is to take two interposers, such as the interposer 2300 illustrated in FIG. 18, and insert top hats of the appropriate size in each of the appropriate apertures in the two interposers, such as top hats 2410, 2420, 2430, and 2440 and interposer 2300 illustrated in FIG. 19. Then, as illustrated in FIG. 20, spring contacts are placed in each top hat in each interposer. Since the top hats have shoulders that are larger than the apertures in the interposers, and since the resiliency of the spring contacts prevent them from falling out of the top hats, the resultant structure illustrated in FIG. 20 is relatively stable and may be moved without fear of losing components, particularly if the interposer is kept horizontal. The spring contacts may be inserted into their respective top hats prior to the top hats being inserted into their respective apertures.

One resultant interposer structure, as illustrated in FIG. 20, is then mated with each end of the structure, as illustrated in FIG. 17, utilizing the guides 2210 and corresponding apertures 2305 for alignment purposes. The resiliency of the spring contacts facilitate their making good electrical contact with the inner conductors and outer shield of each of the twinax cable sections. Furthermore, the resiliency of the spring contacts facilitate the top hats extending outward beyond the apertures of their respective interposers to enable them to make good electrical contact with the printed circuit boards which they are to be mated to.

The interposers are then affixed to the structure, as illustrated in FIG. 24, utilizing appropriate fixing means, such as screws, rivets, pins, or adhesives. The resultant structure is then affixed to its mating printed circuit boards as illustrated in FIG. 24 utilizing guide pins and apertures 2150 for alignment purposes. The guide pins themselves may be used for latching purposes or other suitable connector latching means may be utilized to affix the connector to its mating printed circuit board. As noted above, the resiliency of the spring contacts serve to urge their respective top hats toward the mating contact points on the printed circuit board to facilitate good electrical connection therebetween.

Furthermore, as has been previously noted, since the completed connector assembly has no exposed spring contacts but rather only has small portions of the top hats exposed, the completed connector assembly is relatively rugged and can withstand handling without damage.

While these interconnection systems have been described as advantageous to use in backplane systems, these interconnection systems also find applicability in many other applications where printed circuit boards are required to have high-density electrical interconnections therebetween.

Furthermore, while spring contacts have been shown in the illustrative example as being disposed within top hats, it is contemplated that the present invention may utilize one-piece semi-rigid spring contacts in place of the spring contact/top hat arrangement such as that disclosed in U.S. Pat. No. 6,720,511, entitled One-Piece Semi-Rigid Electrical Contact.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

What is claimed is:

1. An interconnect system, comprising:
a backplane comprising (a) a first signal pad on a first surface of the backplane and (b) a second signal pad also on the first surface of the backplane;
a daughter-board comprising (a) a third signal pad on a first surface of the daughter-board and (b) a fourth signal pad also on the first surface of the daughter-board; and
a compression mount connector for electrically connecting the first signal pad to the third signal pad and the second signal pad to the fourth signal pad, wherein the compression mount connector comprises:
a first generally rectangular interposer member having a first major surface and a second major surface opposite the first major surface, the first major surface facing the first surface of the backplane;

a second generally rectangular interposer member having a first major surface and a second major surface opposite the first major surface, the first major surface facing the first side of the daughter-board;

a differential signal path comprising a first conductor and a second conductor, the first conductor having a first end and a second end, the first end being disposed adjacent to the second surface of the first interposer member, and the second end being disposed adjacent to the second surface of the second interposer member, and the second conductor having a first end and a second end, the first end being disposed adjacent to the second surface of the first interposer member, and the second end being disposed adjacent to the second surface of the second interposer member;

a dielectric material disposed between the first conductor and the second conductor and electrically isolating the first conductor from the second conductor;

a first contact having a conductor contact section, a board contact section and an interim section between the conductor contact section and the board contact section, the conductor contact section being in physical contact with the first end of the first conductor, the board contact section being in physical contact with and pressing against a top surface of the first pad, but not secured to the first pad, and the interim section being disposed in a hole extending from the first surface of the first interposer to the second surface of the first interposer, wherein the first pad exerts a force on the first contact and the first contact is free to move in the direction of the force to a limited extent, wherein the force is in a direction that is generally perpendicular to the first surface of the backplane; and a second contact having a conductor contact section, a board contact section and an interim section between the conductor contact section and the board contact section, the conductor contact section being in physical contact with the first end of the second conductor, the board contact section being in physical contact with and pressing against a top surface of the second pad, but not secured to the second pad, and the interim section being disposed in a hole extending from the first surface of the first interposer to the second surface of the first interposer, wherein the second pad exerts a force on the second contact and the second contact is free to move in the direction of the force to a limited extent, wherein the force is in a direction that is generally perpendicular to the first surface of the backplane.

2. The interconnect system of claim 1, wherein the first contact comprises a spring contact.

3. The interconnect system of claim 2, wherein the first contact further comprises a top hat.

4. The interconnect system of claim 1, further comprising a spacer having a first major surface disposed adjacent the first conductor and having a recess that mirrors the first conductor, the recess being formed in the first major surface of the spacer.

5. The interconnect system of claim 4, wherein the spacer includes a pin for mating with a mating aperture of a second spacer disposed next to the spacer.

6. The interconnect system of claim 4, further comprising a second differential signal path comprising a first conductor and a second conductor, the first conductor having a first end and a second end, the first end being disposed adjacent to the second surface of the first interposer member, and the second end being disposed adjacent to the second surface of the second interposer member, and the second conductor having a first end and a second end, the first end being disposed adjacent to the second surface of the first interposer member, and the second end being disposed adjacent to the second surface of the second interposer member, wherein the spacer has a second major surface disposed adjacent the first conductor of the second differential signal path and has a recess that mirrors said first conductor, the recess being formed in the second major surface of the spacer.

7. In a system comprising a backplane having a first signal pad and a second signal pad on a first surface of the backplane and a daughter-board comprising a third signal pad and a fourth signal pad on a first surface of the daughter-board, a connector for electrically connecting the first signal pad to the third signal pad and the second signal pad to the fourth signal pad, the connector comprising:

a first generally rectangular interposer member having a first surface and a second surface opposite the first surface;

a second generally rectangular interposer member having a first surface and a second surface opposite the first surface;

a first conductor having a first end and a second end, the first end being disposed adjacent to the second surface of the first interposer member, and the second end being disposed adjacent to the second surface of the second interposer member;

a second conductor parallel with the first conductor, the second conductor also having a first end and a second end, the first end being disposed adjacent to the second surface of the first interposer member, and the second end being disposed adjacent to the second surface of the second interposer member;

a dielectric material disposed between the first conductor and the second conductor and electrically isolating the first conductor from the second conductor;

a first contact having a conductor contact section, a board contact section and an interim section between the conductor contact section and the board contact section, the conductor contact section being in physical contact with the first end of the first conductor, the board contact section for pressing against a top surface of the first pad, but not being secured thereto, and the interim section being disposed in a hole extending from the first surface of the first interposer to the second surface of the first interposer;

a second contact having a conductor contact section, a board contact section and an interim section between the conductor contact section and the board contact section, the conductor contact section being in physical contact with the first end of the second conductor, the board contact section for pressing against a top surface of the second pad, but not being secured thereto, and the interim section being disposed in a hole extending from the first surface of the first interposer to the second surface of the first interposer; and a spacer having a first major surface disposed adjacent the first conductor and having a recess that mirrors the first conductor, the recess being formed in the first major surface of the spacer.

8. The connector of claim 7, wherein the first contact comprises a spring contact.

9. The connector of claim 8, wherein the first contact further comprises a top hat.

10. The connector of claim 7, wherein the first and second conductors are used to transmit a differential signal.

11. The connector of claim 7, further comprising a third conductor and a fourth conductor, the third conductor having a first end and a second end, the first end being disposed adjacent to the second surface of the first interposer member, and the second end being disposed adjacent to the second surface of the second interposer member, and the fourth conductor having a first end and a second end, the first end being disposed adjacent to the second surface of the first interposer member, and the second end being disposed adjacent to the second surface of the second interposer member, wherein the spacer has a second major surface disposed adjacent the third conductor and has a second recess that mirrors the third conductor, the second recess being formed in the second major surface of the spacer.

12. The connector of claim 11, further comprising a fifth conductor and a sixth conductor, the fifth conductor having a first end and a second end, the first end being disposed adjacent to the second surface of the first interposer member, and the second end being disposed adjacent to the second surface of the second interposer member, and the sixth conductor having a first end and a second end, the first end being disposed adjacent to the second surface of the first interposer member, and the second end being disposed adjacent to the second surface of the second interposer member, wherein the spacer the first major surface of the spacer is disposed adjacent the fifth conductor and has a third recess that mirrors said fifth conductor, the recess being formed in the first major surface of the spacer.

13. The connector of claim 11, further comprising a second spacer having a first major surface disposed adjacent the fourth conductor and having a recess that mirrors the fourth conductor, the recess being formed in the first major surface of the second spacer.

14. The connector of claim 7, further comprising:

a third contact having a conductor contact section, a board contact section and an interim section between the conductor contact section and the board contact section, the conductor contact section being in physical contact with the second end of the first conductor, the board contact section for making physical contact with the third pad, and the interim section being disposed in a hole extending from the first surface of the second interposer to the second surface of the second interposer;

a fourth contact having a conductor contact section, a board contact section and an interim section between the conductor contact section and the board contact section, the conductor contact section being in physical contact with the second end of the second conductor, the board contact section for making physical contact with the fourth pad, and the interim section being disposed in a hole extending from the first surface of the second interposer to the second surface of the second interposer.

15. The connector of claim 7, wherein the first and second conductors are equal in length.

16. A system, comprising:

a first circuit board comprising a first signal pad on a first surface of the first circuit board;

a second circuit board comprising (a) a second signal pad on a first surface of the second circuit board; and a compression mount connector for electrically connecting the first signal pad to the second signal pad, wherein the compression mount connector comprises:

a first interposer member having a first major surface and a second major surface opposite the first major surface, the first major surface facing the first surface of the first circuit board;

a second interposer member having a first major surface and a second major surface opposite the first major surface, the first major surface facing the first side of the second circuit board;

an elongate conductor, the elongate conductor having a first end and a second end, the first end being disposed adjacent to the second surface of the first interposer member, and the second end being disposed adjacent to the second surface of the second interposer member;

a first contact having a conductor contact section, a board contact section and an interim section between the conductor contact section and the board contact section, the conductor contact section being in physical contact with the first end of the elongate conductor, the board contact section being in physical contact with and pressing against a top surface of the first pad, but not secured to the first pad, and the interim section being disposed in a hole extending from the first surface of the first interposer to the second surface of the first interposer, wherein the first pad exerts a force on the first contact and the first contact is free to move in the direction of the force to a limited extent, wherein the force is in a direction that is generally perpendicular to the first surface of the first circuit board; and a second contact having a conductor contact section, a board contact section and an interim section between the conductor contact section and the board contact section, the conductor contact section being in physical contact with the second end of the elongate conductor, the board contact section being in physical contact with and pressing against a top surface of the second pad, but not secured to the second pad, and the interim section being disposed in a hole extending from the first surface of the second interposer to the second surface of the second interposer, wherein the second pad exerts a force on the second contact and the second contact is free to move in the direction of the force to a limited extent, wherein the force is in a direction that is generally perpendicular to the first surface of the second circuit board.

17. The system of claim 16, wherein the first contact comprises a spring contact.

18. The system of claim 17, wherein the first contact further comprises a top hat.

19. The system of claim 16, further comprising a spacer having a first major surface disposed adjacent the elongate conductor and having a recess that mirrors the elongate conductor, the recess being formed in the first major surface of the spacer.

20. The system of claim 19, further comprising:

a third pad on the first surface of the first circuit board;

a fourth pad on the first surface of the second circuit board;

a second elongate conductor, the second elongate conductor having a first end and a second end, the first end being disposed adjacent to the second surface of the first interposer member, and the second end being disposed adjacent to the second surface of the second interposer member;

a third contact having a conductor contact section, a board contact section and an interim section between the conductor contact section and the board contact section, the conductor contact section being in physical contact with the first end of the second elongate conductor, the board contact section being in physical contact with and pressing against a top surface of the third pad, but not secured to the third pad, and the interim section being disposed in a hole extending from the first surface of the first interposer to the second surface of the first interposer, wherein the third pad exerts a force on the third contact and the third contact is free to move in the direction of the force to a limited extent, wherein the force is in a direction that is generally perpendicular to the first surface of the first circuit board; and a fourth contact having a conductor contact section, a board contact section and an interim section between the conductor contact section and the board contact section, the conductor contact section being in physical contact with the second end of the second elongate conductor, the board contact section being in physical contact with and pressing against a top surface of the fourth pad, but not secured to the fourth pad, and the interim section being disposed in a hole extending from the first surface of the second interposer to the second surface of the second interposer, wherein the fourth pad exerts a force on the fourth contact and the fourth contact is free to move in the direction of the force to a limited extent, wherein the force is in a direction that is generally perpendicular to the first surface of the second circuit board, wherein the spacer includes a second recess that mirrors the second elongate conductor, the second recess being formed in the first major surface of the spacer.

* * * * *